United States Patent
Shimizu

(10) Patent No.: US 9,966,442 B2
(45) Date of Patent: May 8, 2018

(54) SEMICONDUCTOR DEVICE, METHOD OF MANUFACTURING SEMICONDUCTOR DEVICE, INVERTER CIRCUIT, DRIVING DEVICE, VEHICLE, AND ELEVATOR

(71) Applicant: Kabushiki Kaisha Toshiba, Minato-ku (JP)

(72) Inventor: Tatsuo Shimizu, Shinagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days. days.

(21) Appl. No.: 15/430,697

(22) Filed: Feb. 13, 2017

(65) Prior Publication Data
US 2017/0345903 A1 Nov. 30, 2017

(30) Foreign Application Priority Data
May 30, 2016 (JP) .................................. 2016-107938

(51) Int. Cl.
*H01L 21/302* (2006.01)
*H01L 29/40* (2006.01)
(Continued)

(52) U.S. Cl.
CPC ........ *H01L 29/408* (2013.01); *H01L 29/1095* (2013.01); *H01L 29/1608* (2013.01);
(Continued)

(58) Field of Classification Search
None
See application file for complete search history.

(56) References Cited

U.S. PATENT DOCUMENTS 5,742,498 A * 4/1998 Taniguchi ............... H02J 7/248
322/16
6,429,518 B1 8/2002 Endo
(Continued)

FOREIGN PATENT DOCUMENTS

JP 4361625 11/2009
JP 2014-78727 5/2014
(Continued)

OTHER PUBLICATIONS

David et. al. "Silicon oxycarbide glass-graphene composite paper electrode for long-cycle lithium-ion batteries", Nature Communications | 7:10998, Accepted Feb. 9, 2016 | Published Mar. 30, 2016, www.nature.com/naturecommunications.*

*Primary Examiner* — Sitaramarao S Yechuri
(74) *Attorney, Agent, or Firm* — Oblon, McClelland, Maier & Neustadt, L.L.P.

(57) ABSTRACT

A semiconductor device according to an embodiment includes a silicon carbide layer, a silicon oxide layer including carbon, the silicon oxide layer including single bonds between carbon atoms which are at least a part of the carbon, the number of the single bonds between carbon atoms being greater than the number of double bonds between carbon atoms which are at least a part of the carbon, and a region provided between the silicon carbide layer and the silicon oxide layer, the region including at least one element from the group consisting of nitrogen (N), phosphorus (P), arsenic (As), antimony (Sb), bismuth (Bi), scandium (Sc), yttrium (Y), and lanthanoids (La, Ce, Pr, Nd, Pm, Sm, Eu, Gd, Tb, Dy, Ho, Er, Tm, Yb, and Lu).

20 Claims, 13 Drawing Sheets

(51) Int. Cl.
    *H01L 29/16*    (2006.01)
    *H01L 29/10*    (2006.01)
    *H01L 29/78*    (2006.01)
    *H01L 29/66*    (2006.01)
    *H02M 7/537*    (2006.01)
    *B60R 16/02*    (2006.01)
    *B66B 11/04*    (2006.01)
    *B61C 3/00*    (2006.01)

(52) U.S. Cl.
    CPC .... *H01L 29/66068* (2013.01); *H01L 29/7802* (2013.01); *H01L 29/7811* (2013.01); *H02M 7/537* (2013.01); *B60L 2210/42* (2013.01); *B60R 16/02* (2013.01); *B61C 3/00* (2013.01); *B66B 11/043* (2013.01)

(56) References Cited

U.S. PATENT DOCUMENTS

| | | | | |
|---|---|---|---|---|
| 9,437,690 | B2* | 9/2016 | Ishibashi | H01L 29/32 |
| 9,496,393 | B2* | 11/2016 | Mitani | H01L 21/02178 |
| 2007/0243722 | A1* | 10/2007 | Nakamura | H01L 21/049 |
| | | | | 438/787 |
| 2009/0014730 | A1* | 1/2009 | Hwu | H01L 21/0485 |
| | | | | 257/77 |
| 2009/0093132 | A1* | 4/2009 | Xu | C23C 16/22 |
| | | | | 438/780 |
| 2010/0221917 | A1* | 9/2010 | Masuda | H01J 37/3244 |
| | | | | 438/692 |
| 2011/0309409 | A1* | 12/2011 | Yamazaki | H01L 27/0262 |
| | | | | 257/146 |
| 2012/0083127 | A1* | 4/2012 | Clark | B81C 1/00031 |
| | | | | 438/703 |
| 2012/0199846 | A1 | 8/2012 | Shimizu et al. | |
| 2013/0244407 | A1* | 9/2013 | Yokoyama | H01L 29/6606 |
| | | | | 438/478 |
| 2015/0084068 | A1 | 3/2015 | Shimizu | |
| 2015/0303271 | A1* | 10/2015 | Tanaka | H01L 29/78 |
| | | | | 257/77 |
| 2016/0028224 | A1* | 1/2016 | Yamada | H02M 7/487 |
| | | | | 363/56.11 |
| 2016/0101963 | A1* | 4/2016 | Nakari | B66B 1/36 |
| | | | | 187/254 |
| 2016/0218188 | A1 | 7/2016 | Hiyoshi et al. | |
| 2017/0345657 | A1 | 11/2017 | Shimizu et al. | |

FOREIGN PATENT DOCUMENTS

| | | |
|---|---|---|
| JP | 2015-61069 | 3/2015 |
| JP | 2015-65288 | 4/2015 |
| JP | 2015-146450 | 8/2015 |
| JP | 2017-216305 A | 12/2017 |

* cited by examiner

SEMICONDUCTOR DEVICE, METHOD OF MANUFACTURING SEMICONDUCTOR DEVICE, INVERTER CIRCUIT, DRIVING DEVICE, VEHICLE, AND ELEVATOR

CROSS-REFERENCE TO RELATED APPLICATION

This application is based upon and claims the benefit of priority from Japanese Patent Application No. 2016-107938, filed on May 30, 2016, the entire contents of which are incorporated herein by reference.

FIELD

Embodiments described herein relate generally to a semiconductor device, a method for manufacturing a semiconductor device, an inverter circuit, a driving device, a vehicle, and an elevator.

BACKGROUND

Silicon carbide (SiC) is expected to be used as a material for a next-general semiconductor device. SiC has better physical properties than silicon (Si). For example, SiC has a bandgap that is three times wider than that of Si, a breakdown field strength that is about ten times higher than that of Si, and a thermal conductivity that is about three times higher than that of Si. These characteristics can be used to achieve a semiconductor device which has low loss and can operate at a high temperature.

However, for example, when silicon carbide is used to form a metal oxide semiconductor field effect transistor (MOSFET), there is the problem that the mobility of carriers is reduced.

DETAILED DESCRIPTION

Figure 1:
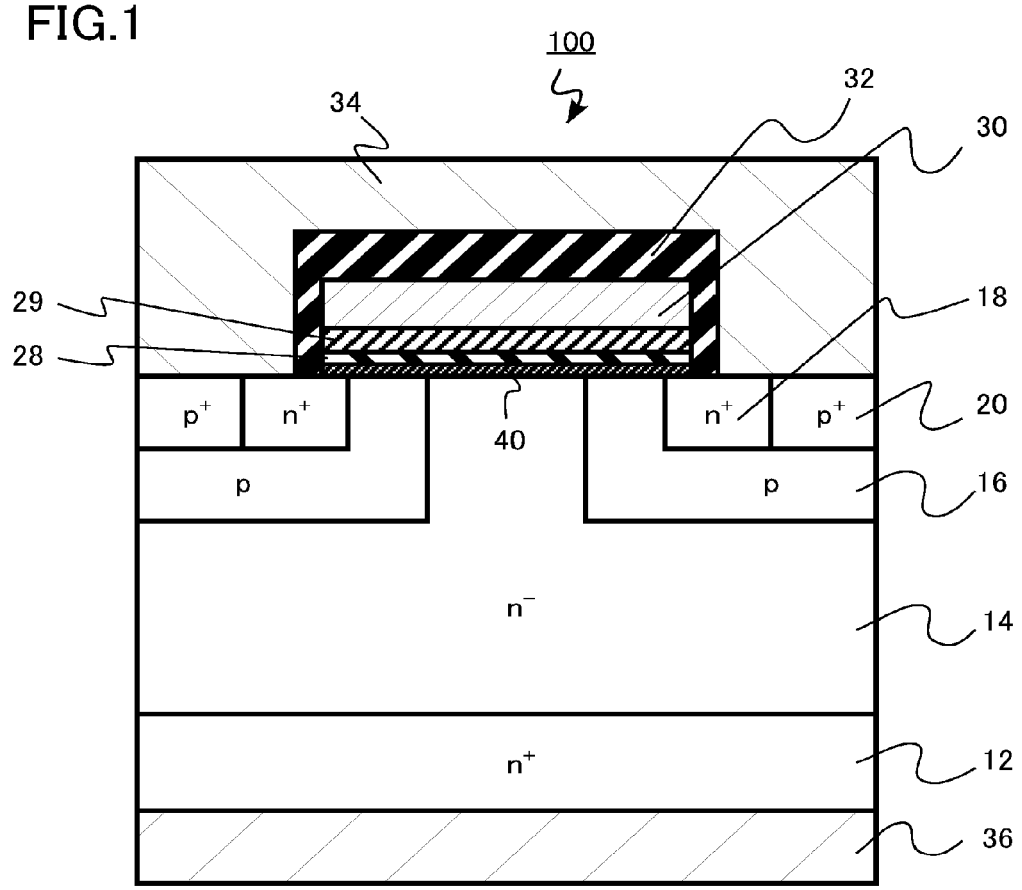
FIG. 1 is a cross-sectional view schematically illustrating a semiconductor device according to a first embodiment.

A semiconductor device according to an embodiment includes a silicon carbide layer, a silicon oxide layer including carbon, the silicon oxide layer including single bonds between carbon atoms which are at least a part of the carbon, the number of the single bonds between carbon atoms being greater than the number of double bonds between carbon atoms which are at least a part of the carbon, and a region provided between the silicon carbide layer and the silicon oxide layer, the region including at least one element from the group consisting of nitrogen (N), phosphorus (P), arsenic (As), antimony (Sb), bismuth (Bi), scandium (Sc), yttrium (Y), and lanthanoids (La, Ce, Pr, Nd, Pm, Sm, Eu, Gd, Tb, Dy, Ho, Er, Tm, Yb, and Lu).

Hereinafter, embodiments of the invention will be described with reference to the drawings. In the following description, the same members are denoted by the same reference numerals and the description thereof will not be repeated.

In the following description, $n^+$, n, $n^-$, $p^+$, p, and $p^-$ indicate the relative levels of impurity concentration in each conductivity type. That is, $n^+$ indicates an n-type impurity concentration which is higher than that of n and $n^-$ indicates an n-type impurity concentration which is lower than that of n. In addition, $p^+$ indicates a p-type impurity concentration which is higher than that of p and p indicates a p-type impurity concentration which is lower than that of p. In some cases, an $n^+$ type and an $n^-$ type are simply referred to as an n type and a $p^+$ type and a $p^-$ type are simply referred to as a p type.

First Embodiment

A semiconductor device according to this embodiment includes a silicon carbide layer, a silicon oxide layer having single bonds between carbon atoms and double bonds between the carbon atoms, the number of single bonds being greater than the number of double bonds, and a region which is provided between the silicon carbide layer and the silicon oxide layer and includes at least one element selected from the group consisting of nitrogen (N), phosphorus (P), arsenic (As), antimony (Sb), bismuth (Bi), scandium (Sc), yttrium (Y), and lanthanoids (La, Ce, Pr, Nd, Pm, Sm, Eu, Gd, Tb, Dy, Ho, Er, Tm, Yb, and Lu).

FIG. 1 is a cross-sectional view schematically illustrating a MOSFET which is the semiconductor device according to this embodiment. A MOSFET 100 is a double implantation MOSFET (DIMOSFET) in which a p well and a source region are formed by ion implantation. In addition, the MOSFET 100 is an n-channel MOSFET having electrons as carriers.

The MOSFET 100 includes a silicon carbide substrate 12, a drift layer (silicon carbide layer) 14, a p well region (silicon carbide layer) 16, a source region 18, a p well contact region 20, an interface region (region) 40, a silicon oxide layer 28, an insulating layer 29, a gate electrode 30, an interlayer insulating film 32, a source electrode 34, and a drain electrode 36.

The silicon carbide substrate 12 is, for example, an $n^+$ 4H—SiC substrate. The silicon carbide substrate 12 has, for example, nitrogen (N) as n-type impurities. The n-type impurity concentration of the silicon carbide substrate 12 is, for example, equal to or greater than $1\times10^{18}$ cm$^{-3}$ and equal to or less than $1\times10^{20}$ cm$^{-3}$.

For example, the front surface of the silicon carbide substrate 12 is inclined at an angle that is equal to or greater than 0 degrees and equal to or less than 8 degrees with respect to a (0001) face. The (0001) face is referred to as a silicon face. For example, the front surface of the silicon carbide substrate 12 is inclined at an angle that is equal to or greater than 0 degrees and equal to or less than 8 degrees with respect to a (000-1) face. The (000-1) face is referred to as a carbon face.

The drift layer 14 is provided on the front surface of the silicon carbide substrate 12. The drift layer 14 is an n silicon carbide layer. The drift layer 14 includes, for example, nitrogen as n-type impurities.

The n-type impurity concentration of the drift layer 14 is, for example, equal to or greater than $5\times10^{15}$ cm$^{-3}$ and equal to or less than $2\times10^{16}$ cm$^{-3}$. The drift layer 14 is, for example, a SiC epitaxial growth layer that is formed on the silicon carbide substrate 12 by epitaxial growth.

A surface of the drift layer 14 is also inclined at an angle that is equal to or greater than 0 degrees and equal to or less than 8 degrees with respect to the silicon face. The thickness of the drift layer 14 is, for example, equal to or greater than 5 μm and equal to or less than 100 μm.

The p well region 16 is provided in a portion of the surface of the drift layer 14. The p well region 16 is a p-type silicon carbide region. The p well region 16 includes, for example, aluminum (Al) as p-type impurities. The p-type impurity concentration of the p well region 16 is, for example, equal to or greater than $5\times10^{15}$ cm$^{-3}$ and equal to or less than $1\times10^{17}$ cm$^{-3}$.

The depth of the p well region 16 is, for example, equal to or greater than 0.4 μm and equal to or less than 0.8 μm. The p well region 16 functions as a channel region of the MOSFET 100.

A surface of the p well region 16 is also inclined at an angle that is equal to or greater than 0 degrees and equal to or less than 8 degrees with respect to the silicon face.

The source region 18 is provided in a portion of the surface of the p well region 16. The source region 18 is an n$^+$ silicon carbide layer. The source region 18 includes, for example, phosphorus (P) as n-type impurities. The n-type impurity concentration of the source region 18 is, for example, equal to or greater than $1\times10^{18}$ cm$^{-3}$ and equal to or less than $1\times10^{22}$ cm$^{-3}$.

The depth of the source region 18 is less than the depth of the p well region 16. The depth of the source region 18 is, for example, equal to or greater than 0.2 μm and equal to or less than 0.4 μm.

The well contact region 20 is provided in a portion of the surface of the p well region 16. The well contact region 20 is provided on the side of the source region 18. The well contact region 20 is a p$^+$ silicon carbide region.

The well contact region 20 includes, for example, aluminum as p-type impurities. The p-type impurity concentration of the well contact region 20 is, for example, equal to or greater than $1\times10^{18}$ cm$^{-3}$ and equal to or less than $1\times10^{22}$ cm$^{-3}$.

The depth of the p well contact region 20 is less than the depth of the p well region 16. The depth of the p well contact region 20 is, for example, equal to or greater than 0.2 μm and equal to or less than 0.4 μm.

The interface region 40 is provided between the drift layer 14 and the silicon oxide layer 28 and between the p well region 16 and the silicon oxide layer 28. The interface region 40 includes at least one element (termination element) selected from the group consisting of nitrogen (N), phosphorus (P), arsenic (As), antimony (Sb), bismuth (Bi), scandium (Sc), yttrium (Y), and lanthanoids (La, Ce, Pr, Nd, Pm, Sm, Eu, Gd, Tb, Dy, Ho, Er, Tm, Yb, and Lu).

Figure 2:
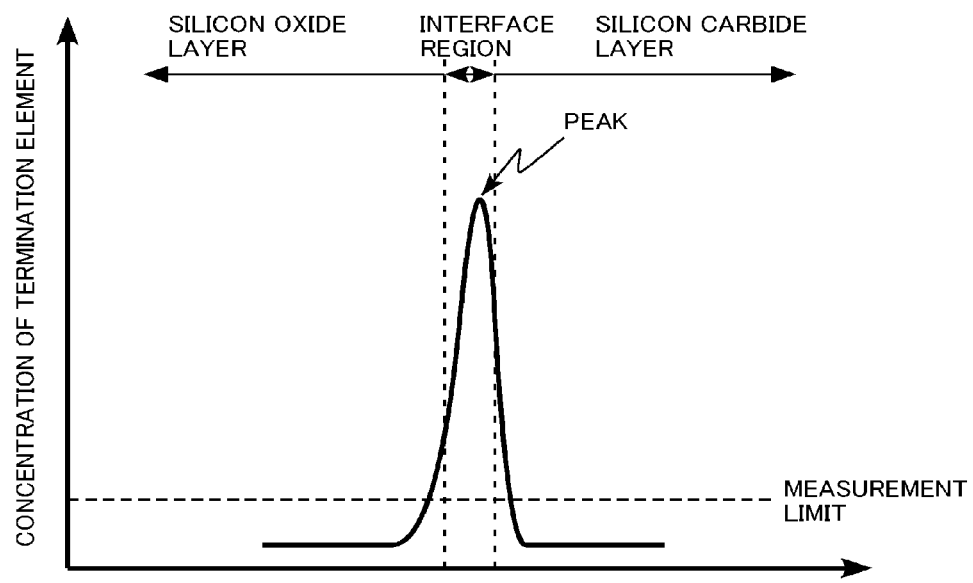
FIG. 2 is a diagram illustrating a concentration distribution of a termination element according to the first embodiment.

FIG. 2 is a diagram illustrating the concentration distribution of the termination element according to this embodiment.

The termination element is segregated at the interface between the drift layer 14 and the silicon oxide layer 28 and the interface between the p well region (silicon carbide layer) 16 and the silicon oxide layer 28. The peak of the concentration distribution of the termination element is located in the interface region 40.

The full width at half maximum of the concentration distribution of the termination element at the peak is, for example, equal to or less than 1 nm. In addition, the full width at half maximum of the concentration distribution is preferably, for example, equal to or less than 0.25 nm and more preferably less than 0.2 nm.

The termination element substitutes a silicon atom or a carbon atom in the uppermost layer of the drift layer 14 and the p well region 16. Since the termination element substitutes the atom in the uppermost layer, it is three-fold coordinated to the silicon carbide layer. In other words, the termination element is located at the position of a silicon atom or a carbon atom in the crystal lattice of silicon carbide. That is, the termination element is three-fold coordinated to the carbon atom in the silicon carbide layer or is three-fold coordinated to the silicon atom in the silicon carbide layer.

The peak of the concentration distribution of the termination element in the interface region 40 is, for example, equal to or greater than $4\times10^{16}$ cm$^{-3}$ and equal to or less than $4\times10^{20}$ cm$^{-3}$. In addition, the peak of the concentration distribution of the termination element is preferably, for example, equal to or greater than $4\times10^{16}$ cm$^{-3}$ and equal to or less than $4\times10^{19}$ cm$^{-3}$ and more preferably equal to or greater than $4\times10^{16}$ cm$^{-3}$ and equal to or less than $4\times10^{18}$ cm$^{-3}$.

The concentration and distribution of the termination element in the interface region 40 can be measured by, for example, secondary ion mass spectroscopy (SIMS). For the concentration and distribution of the termination element, the state of electrons and the space distribution thereof can be specified by, for example, XPS, TEM-EDX, an atom probe, and HR-RBS. In addition, a vibration mode based on a structure in which the termination element is three-fold coordinated to the silicon carbide layer is observed by infrared spectroscopy and Raman spectroscopy.

The concentration of the termination element in the silicon oxide layer 28 and the silicon carbide layer is, for example, equal to or less than the measurement limit of SIMS. The measurement limit of SIMS is, for example, $2\times10^{16}$ cm$^{-3}$.

The silicon oxide layer 28 is provided between the p well region 16 and the gate electrode 30. The silicon oxide layer 28 is continuously formed on the surface of the drift layer 14 and the p well region 16.

The thickness of the silicon oxide layer 28 is, for example, equal to or greater than 1 nm and equal to or less than 10 nm. The silicon oxide layer 28 functions as a gate insulating layer of the MOSFET 100.

The silicon oxide layer 28 includes carbon. The carbon concentration of the silicon oxide layer 28 is, for example, equal to or greater than $2\times10^{16}$ cm$^{-3}$ and equal to or less than $2\times10^{22}$ cm$^{-3}$.

There is a bond between carbon (C) atoms in the silicon oxide layer 28. The number of single bonds between carbon atoms in the silicon oxide layer 28 is greater than the number of double bonds between carbon atoms in the layer.

The count value of photoelectrons caused by the single bond between carbon atoms can be compared with the count value of photoelectrons caused by the double bond between carbon atoms by, for example, X-ray photoelectron spectroscopy (XPS) to determine the number of single bonds between carbon atoms and the number of double bonds between carbon atoms in the silicon oxide layer 28.

In addition, magnitude relation between the number of single bonds between carbon atoms and the number of double bonds between carbon atoms in the silicon oxide layer 28 can be determined by, for example, infrared spectroscopy and Raman spectroscopy.

For example, there is a bond between a carbon atom and an oxygen (O) atom in the silicon oxide layer 28. In addition, there is a bond between a carbon atom and a hydrogen (H) atom in the silicon oxide layer 28. There is a bond between a carbon atom and a deuterium (D) atom in the silicon oxide layer 28. There is a bond between a carbon atom and a fluorine (F) atom in the silicon oxide layer 28. There is a bond between a carbon atom and a hydroxyl group (OH) in the silicon oxide layer 28.

The bond between a carbon atom and an oxygen (O) atom, the bond between a carbon atom and a hydrogen (H) atom, the bond between a carbon atom and a deuterium (D) atom, the bond between a carbon atom and a fluorine (F) atom, and the bond between a carbon atom and a hydroxyl group (OH) can be checked by, for example, X-ray photoelectron spectroscopy. In addition, the bond between a carbon atom and an oxygen (O) atom, the bond between a carbon atom and a hydrogen (H) atom, the bond between a carbon atom and a deuterium (D) atom, the bond between a carbon atom and a fluorine (F) atom, and the bond between a carbon atom and a hydroxyl group (OH) can be determined by, for example, infrared spectroscopy and Raman spectroscopy.

The distribution of carbon atoms in the silicon oxide layer 28 in the thickness direction is substantially identical to the distributions of oxygen atoms placed between the carbon atoms having a single bond therebetween, hydrogen atoms bonded to two carbon atoms having a single bond therebetween, deuterium atoms bonded to two carbon atoms having a single bond therebetween, fluorine atoms bonded to two carbon atoms having a single bond therebetween, and a hydroxyl group bonded to two carbon atoms having a single bond therebetween. The concentration and distribution of carbon, oxygen, hydrogen, deuterium, and fluorine having the above-mentioned bonding state in the silicon oxide layer 28 in the thickness direction can be measured by, for example, secondary ion mass spectroscopy (SIMS). In addition, for the concentration and distribution of carbon, oxygen, hydrogen, deuterium, and fluorine in the silicon oxide layer 28, the state of electrons and the space distribution thereof can be specified by, for example, XPS, TEM-EDX, an atom probe, and HR-RBS.

FIGS. 3A, 3B, 3C, 3D, and 3E are diagrams illustrating the silicon oxide layer according to this embodiment. FIGS. 3A, 3B, 3C, 3D, and 3E are diagrams illustrating the bonding state of carbon atoms in the silicon oxide layer 28.

Figure 3A:
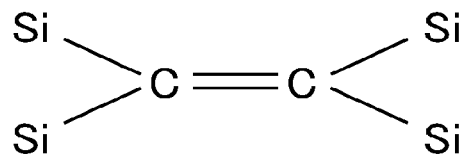
FIGS. 3A, 3B, 3C, 3D, and 3E are diagrams illustrating a silicon oxide layer according to the first embodiment.

FIG. 3A is a diagram illustrating a double bond between carbon atoms. FIGS. 3B, 3C, 3D, and 3E are diagrams illustrating a single bond between carbon atoms.

Figure 3B:
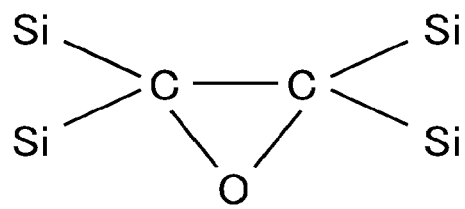

FIG. 3B illustrates a case in which carbon atoms having a single bond therebetween are bonded to an oxygen atom. Two carbon atoms and one oxygen atom form a C—C—O cyclic structure. In other words, the same oxygen atom is bonded to two carbon atoms having a single bond therebetween.

Figure 3C:
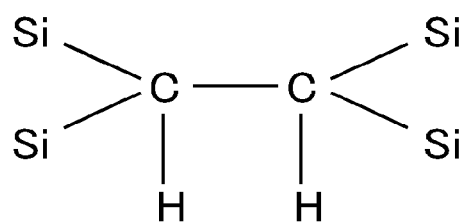

FIG. 3C illustrates a case in which carbon atoms having a single bond therebetween are bonded to hydrogen atoms. FIG. 3C illustrates a structure in which one hydrogen atom is bonded to each of two carbon atoms having a single bond therebetween. This structure is the same as that for deuterium.

Figure 3D:
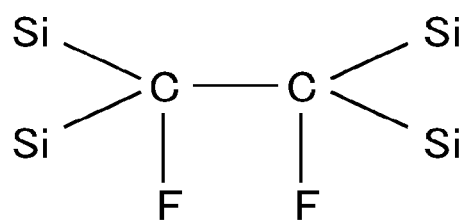

FIG. 3D illustrates a case in which carbon atoms having a single bond therebetween are bonded to fluorine atoms. FIG. 3D illustrates a structure in which one fluorine atom is bonded to each of two carbon atoms having a single bond therebetween.

Figure 3E:
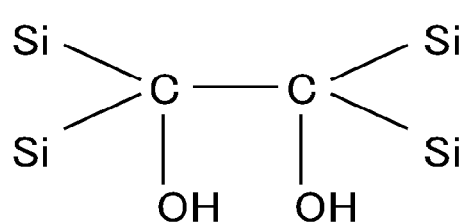

FIG. 3E illustrates a case in which carbon atoms having a single bond therebetween are bonded to hydroxyl groups. FIG. 3E illustrates a structure in which one hydroxyl group is bonded to each of two carbon atoms having a single bond therebetween.

FIGS. 3A, 3B, 3C, 3D, 3E illustrate examples of the structure in which two silicon atoms are bonded to each of two carbon atoms having a single bond or a double bond therebetween. However, instead of the silicon atoms, oxygen atoms may be bonded.

The insulating layer 29 is provided between the silicon oxide layer 28 and the gate electrode 30. The silicon oxide layer 28 and the insulating layer 29 function as a gate insulating layer of the MOSFET 100.

The insulating layer 29 is, for example, a deposited film which is formed by a chemical vapor deposition (CVD) method or a physical vapor deposition (PVD) method. The insulating layer 29 is, for example, a silicon oxide film.

When the insulating layer 29 is a silicon oxide film, some cases, a bond between carbon (C) atoms is present in the insulating layer 29. For example, a bond between carbon (C) atoms is present when the insulating layer 29 is a CVD film having TEOS as a precursor. The number of single bonds between carbon atoms in the silicon oxide film is greater than the number of double bonds between carbon atoms in the layer.

In addition, when the insulating layer 29 is a silicon oxide film, for example, a bond between a carbon atom and an oxygen (O) atom is present in the silicon oxide film. In addition, for example, a bond between a carbon atom and a deuterium (D) atom is present in the silicon oxide film. For example, a bond between a carbon atom and a hydrogen (H) atom is present in the silicon oxide film. For example, a bond between a carbon atom and a fluorine (F) atom is present in the silicon oxide film. For example, a bond between a carbon atom and a hydroxyl group (OH) is present in the silicon oxide film.

An insulating film having a higher permittivity than the silicon oxide layer 28 may be used as the insulating layer 29. The insulating layer 29 is, for example, a silicon oxynitride (SiON) film, a silicon nitride (SiN) film, a hafnium oxide ($HfO_2$) film, a hafnium oxynitride (HfON) film, a hafnium oxide silicate (HfSiO) film, a hafnium oxynitride silicate (HfSiON) film, a zirconium oxide ($ZrO_2$) film, a zirconium oxynitride (ZrON) film, a zirconium oxide silicate (ZrSiO) film, a zirconium oxynitride silicate (ZrSiON) film, an aluminum oxide (AlO) film, or an aluminum oxynitride (AlON) film. The insulating layer 29 may be a stacked film of these films. For example, a stacked film of a SiON film and a HfSiON film or a stacked film of a $ZrO_2$ film, an $Al_2O_3$ film, a $ZrO_2$ film, and an $Al_2O_3$ film is effective.

The thickness of the insulating layer 29 is, for example, equal to or greater than 20 nm and equal to or less than 150 nm.

The gate electrode 30 is provided on the insulating layer 29. The silicon oxide layer 28 and the insulating layer 29 are provided between the gate electrode 30 and the interface region 40.

For example, polysilicon including n-type impurities or p-type impurities can be applied to the gate electrode 30.

The interlayer insulating film 32 is formed on the gate electrode 30. The interlayer insulating film 32 is, for example, a silicon oxide film.

The source electrode 34 is electrically connected to the source region 18 and the p well contact region 20. The source electrode 34 also functions as a p well electrode that applies potential to the p well region 16.

The source electrode 34 has, for example, a stacked structure of a nickel (Ni) barrier metal layer and an aluminum metal layer provided on the barrier metal layer. The nickel barrier metal layer and the silicon carbide layer may react with each other to form nickel silicide (for example, NiSi or $Ni_2Si$). An alloy may be formed by the reaction between the nickel barrier metal layer and the aluminum metal layer.

The drain electrode 36 is formed on a surface of the silicon carbide substrate 12 opposite to the drift layer 14, that is, on the rear surface. The drain electrode 36 is made of, for example, nickel. Nickel may react with the silicon carbide substrate 12 to form nickel silicide (for example, NiSi or $Ni_2Si$).

In this embodiment, the n-type impurities are, for example, nitrogen or phosphorus. Arsenic (As) or antimony (Sb) may be applied as the n-type impurities.

In this embodiment, the p-type impurities are, for example, aluminum. Boron (B), gallium (Ga), or indium (In) may be applied as the p-type impurities.

Next, a method for manufacturing the semiconductor device according to this embodiment will be described.

The method for manufacturing the semiconductor device according to this embodiment includes: forming a silicon oxide layer on a silicon carbide layer; and performing a heat treatment in an atmosphere that includes at least one of oxygen, hydrogen, deuterium, fluorine, and water and includes at least one element selected from the group consisting of nitrogen (N), phosphorus (P), arsenic (As), antimony (Sb), bismuth (Bi), scandium (Sc), yttrium (Y), and lanthanoids (La, Ce, Pr, Nd, Pm, Sm, Eu, Gd, Tb, Dy, Ho, Er, Tm, Yb, and Lu) while irradiating the silicon oxide layer with ultraviolet rays.

Figure 4:
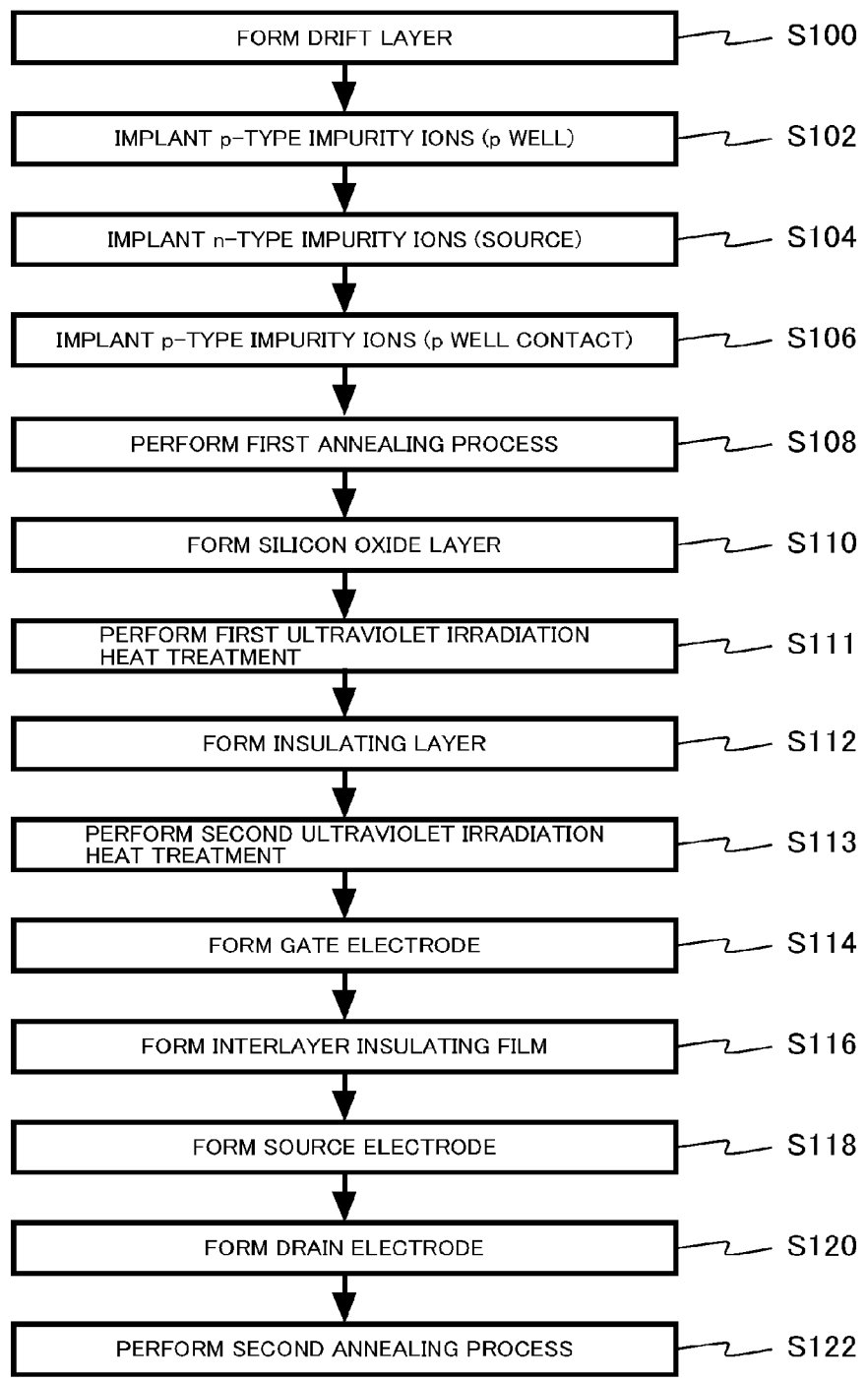
FIG. 4 is a process flowchart illustrating a method for manufacturing the semiconductor device according to the first embodiment.

FIG. 4 is a process flowchart illustrating the method for manufacturing the semiconductor device according to this embodiment.

As illustrated in FIG. 4, the method for manufacturing the semiconductor device according to this embodiment includes a drift layer forming step (Step S100), a p-type impurity ion implantation step (Step S102), an n-type impurity ion implantation step (Step S104), a p-type impurity ion implantation step (Step S106), a first annealing step (Step S108), a silicon oxide layer forming step (Step S110), a first ultraviolet irradiation heat treatment step (Step S111), an insulating layer forming step (Step S112), a second ultraviolet irradiation heat treatment step (Step S113), a gate electrode forming step (Step S114), an interlayer insulating film forming step (Step S116), a first electrode forming step (Step S118), a second electrode forming step (Step S120), and a second annealing step (Step S122).

First, the n$^+$ silicon carbide substrate 12 is prepared. The silicon carbide substrate 12 is made of, for example, 4H—SiC. The silicon carbide substrate 12 is, for example, a silicon carbide wafer W.

The silicon carbide substrate 12 includes nitrogen as n-type impurities. The n-type impurity concentration of the silicon carbide substrate 12 is, for example, equal to or greater than $1\times10^{18}$ cm$^{-3}$ and equal to or less than $1\times10^{20}$ cm$^{-3}$. The thickness of the silicon carbide substrate 12 is, for example, 350 μm. The silicon carbide substrate 12 may be thinned to about 90 μm before the drain electrode is formed on the rear surface of the silicon carbide substrate 12.

In Step S100, the drift layer 14 is formed on the silicon face of the silicon carbide substrate 12 by an epitaxial growth method. The drift layer 14 is made of 4H—SiC.

The drift layer 14 includes nitrogen as n-type impurities. The n-type impurity concentration of the drift layer 14 is, for example, equal to or greater than $5\times10^5$ cm$^{-3}$ and equal to or less than $2\times10^{16}$ cm$^{-3}$. The thickness of the drift layer 14 is, for example, equal to or greater than 5 μm and equal to or less than 100 μm.

In Step S102, first, a first mask member is formed by patterning using photolithography and etching. Then, aluminum ions which are p-type impurity ions are implanted into the drift layer 14, using the first mask member as an ion implantation mask. The p well region 16 is formed by the ion implantation.

In Step S104, first, a second mask member is formed by patterning using photolithography and etching. Then, nitrogen ions which are n-type impurity ions are implanted into the drift layer 14, using the second mask member as an ion implantation mask, to form the source region 18.

In Step S106, a third mask member is formed by patterning using photolithography and etching. Then, aluminum ions which are p-type impurity ions are implanted into the drift layer 14, using the third mask member as an ion implantation mask, to form the p well contact region 20.

In Step S108, a first annealing process for activating the p-type impurities and the n-type impurities is performed. For example, this annealing process is performed under the conditions of a heating temperature of 1750° C. and a heating time of 30 minutes, using argon (Ar) gas as atmosphere gas.

In Step S110, the drift layer 14 and the p well region (silicon carbide layer) 16 are thermally oxidized and the silicon oxide layer 28 is formed on the drift layer 14 and the p well region 16. The silicon oxide layer 28 functions as a gate insulating layer.

For example, the thermal oxidation is performed in a dry oxygen atmosphere. The thermal oxidation temperature is, for example, equal to or greater than 800° C. and equal to or less than 1000° C. The thickness of the silicon oxide layer 28 is, for example, equal to or greater than 1 nm and equal to or less than 10 nm.

It is preferable that the thermal oxidation temperature be equal to or greater than 800° C. and equal to or less than 1000° C., in order to improve controllability for the thickness of the silicon oxide layer 28.

When the silicon oxide layer 28 is formed by thermal oxidation at a temperature that is equal to or greater than 800° C. and equal to or less than 1000° C., the carbon concentration of the silicon oxide layer 28 is, for example, equal to or greater than $2\times10^{19}$ cm$^{-3}$ and equal to or less than $2\times10^{22}$ cm$^{-3}$. In addition, for example, the carbon concentration is equal to or greater than $2\times10^{20}$ cm$^{-3}$ and equal to or less than $2\times10^{21}$ cm$^{-3}$.

Surplus carbon which has been generated by the thermal oxidation of the drift layer 14 and the p well region 16 is introduced into the silicon oxide layer 28. Then, the carbon introduced into the silicon oxide layer 28 forms a double bond in the silicon oxide layer 28 and is stabilized.

In Step S111, a heat treatment is performed while the silicon oxide layer 28 is irradiated with ultraviolet rays. The heat treatment is performed in an atmosphere that includes at least one of oxygen (O), hydrogen (H), deuterium (D), fluorine (F), and water ($H_2O$) and includes at least one element (termination element) selected from the group consisting of nitrogen (N), phosphorus (P), arsenic (As), antimony (Sb), bismuth (Bi), scandium (Sc), yttrium (Y), and lanthanoids (La, Ce, Pr, Nd, Pm, Sm, Eu, Gd, Tb, Dy, Ho, Er, Tm, Yb, and Lu).

The heat treatment temperature is, for example, equal to or greater than 300° C. and equal to or less than 900° C. However, the heat treatment temperature is equal to or less than 800° C. in the case of the C-face, is equal to or less than 850° C. in the case of the a-face, the m-face, and the (0-33-8) face, and is equal to or less than 900° C. in the case of the Si face, in order to prevent the oxidation of the silicon carbide layer. The typical heat treatment temperature is 700° C. which can be applied to any plane orientation. The energy of the ultraviolet rays is, for example, equal to or greater than 3.0 eV and equal to or less than 4.5 eV.

A silicon atom having a dangling bond or a carbon atom having a dangling bond in the uppermost layer of the drift layer 14 and the p well region 16 is excited by the irradiation with ultraviolet rays. In addition, the termination element in the atmosphere is activated by the irradiation with ultraviolet rays. The excited silicon atom having a dangling bond in the outermost surface or the excited carbon atom having a dangling bond in the outermost surface is substituted with the activated termination element.

In addition, the double bond between carbon atoms in the silicon oxide layer 28 is converted into a single bond between carbon atoms by the irradiation with ultraviolet rays. The carbon atoms having a single bond therebetween are bonded to, for example, an oxygen atom and are stabilized in the silicon oxide layer 28.

Figure 5:
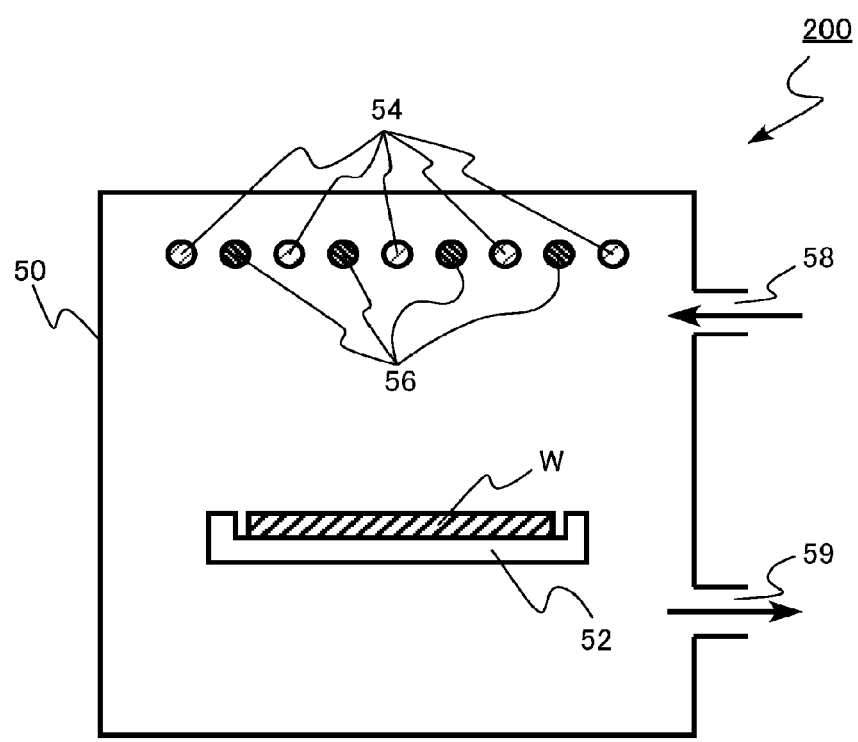
FIG. 5 is a cross-sectional view schematically illustrating a semiconductor manufacturing device used in the manufacturing method according to the first embodiment.

FIG. 5 is a cross-sectional view schematically illustrating a semiconductor manufacturing device which is used in the first ultraviolet irradiation heat treatment in Step S111. The semiconductor manufacturing device is an infrared lamp heating device 200.

The infrared lamp heating device 200 includes a processing chamber 50, a susceptor (holding portion) 52, an infrared lamp 54, an ultraviolet lamp 56, a gas supply port 58, and a gas exhaust port 59.

The susceptor 52 is provided in the processing chamber 50. The silicon carbide wafer W can be placed on the susceptor 52.

The infrared lamp 54 is provided in the processing chamber 50. The silicon carbide wafer W is heated by infrared rays emitted from the infrared lamp 54.

The ultraviolet lamp 56 is provided in the processing chamber 50. The ultraviolet lamp 56 emits ultraviolet rays to the silicon carbide wafer W.

Gas for controlling an atmosphere in the processing chamber 50 is supplied to the processing chamber 50 through the gas supply port 58.

Gas in the processing chamber 50 is discharged through the gas exhaust port 59.

During the first ultraviolet irradiation heat treatment in Step S111, the silicon carbide wafer W having the silicon oxide layer 28 formed therein is placed on the susceptor 52. Then, gas is supplied to the processing chamber 50 through the gas supply port 58.

During the supply of the gas, the silicon carbide wafer W is heated by the infrared lamp 54 while the ultraviolet lamp 56 emits ultraviolet rays to the silicon carbide wafer W.

The gas supplied in Step S111 includes, for example, at least one of oxygen (O), hydrogen (H), deuterium (D), fluorine (F), and water ($H_2O$). In addition, the supplied gas includes at least one termination element selected from the group consisting of nitrogen (N), phosphorus (P), arsenic (As), antimony (Sb), bismuth (Bi), scandium (Sc), yttrium (Y), and lanthanoids (La, Ce, Pr, Nd, Pm, Sm, Eu, Gd, Tb, Dy, Ho, Er, Tm, Yb, and Lu).

The supplied gas includes, for example, at least one of nitrogen oxide, nitrogen hydride, nitrogen deuteride, nitrogen fluoride, phosphorus oxide, phosphorus hydride, phosphorus deuteride, phosphorus fluoride, arsenic oxide, arsenic hydride, arsenic deuteride, arsenic fluoride, bismuth oxide, bismuth hydride, bismuth deuteride, bismuth fluoride, scandium oxide, scandium hydride, scandium deuteride, scandium fluoride, yttrium oxide, yttrium hydride, yttrium deuteride, yttrium fluoride, lanthanoid oxide, lanthanoid hydride, lanthanoid deuteride, and lanthanoid fluoride. In addition, gas including the termination element and oxygen at the same time, such as oxide hydride gas, oxide chloride gas, or oxide fluoride gas, is effective.

The supplied gas includes, for example, gases represented by the following chemical formulas: $NO$, $N_2O$, $NO_2$, $NH_3$, $ND_3$, $NF_3$, $NH_2$, $ND_2$, $NF_2$, $NOH_3$, $NOCl_3$, $NOF_3$, $PO$, $P_2O$, $PO_2$, $P_2O_5$, $PH_3$, $PD_3$, $PF_3$, $PH_2$, $PD_2$, $PF_2$, $POH_3$, $POCl_3$, $POF_3$, $AsO$, $As_2O$, $AsO_2$, $As_2O_5$, $AsH_3$, $AsD_3$, $AsF_3$, $AsH_2$, $AsD_2$, $AsF_2$, $AsOH_3$, $AsOCl_3$, $AsOF_3$, $SbO$, $Sb_2O$, $SbO_2$, $Sb_2O_5$, $SbH_3$, $SbD_3$, $SbF_3$, $SbH_2$, $SbD_2$, $SbF_2$, $SbOH_3$, $SbOCl_3$, $SbOF_3$, $BiO$, $Bi_2O$, $BiO_2$, $Bi_2O_5$, $BiH_3$, $BiD_3$, $BiF_3$, $BiH_2$, $BiD_2$, $BiF_2$, $BiOH_3$, $BiOCl_3$, $BiOF_3$, $ScO$, $Sc_2O_3$, $ScH_3$, $ScD_3$, $ScF_3$, $ScH_2$, $ScD_2$, $ScF_2$, $ScOH_3$, $ScOCl_3$, $ScOF_3$, $YO$, $Y_2O_3$, $YH_2$, $YH_3$, $YD_2$, $YD_3$, $YF_2$, $YF_3$, $YOH_3$, $YOCl_3$, $YOF_3$, $LnO$, $Ln_2O_3$, $LnH_2$, $LnH_3$, $LnD_2$, $LnD_3$, $LnF_2$, $LnF_3$, $LnOH_3$, $LnOCl_3$, and $LnOF_3$ (Ln=lanthanoid). The above-mentioned gases may be mixed with each other and then used.

The supplied gas may include, for example, inert gas or water ($H_2O$) as carrier gas or diluent gas. Examples of the inert gas include nitrogen gas ($N_2$), helium gas (He), neon gas (Ne), argon gas (Ar), krypton gas (Kr), and xenon gas (Xe).

In Step S112, the insulating layer 29 is formed on the silicon oxide layer 28. The insulating layer 29 is formed by, for example, a CVD method or a PVD method. The thickness of the insulating layer 29 is, for example, equal to or greater than 20 nm and equal to or less than 150 nm.

The insulating layer 29 is a silicon oxide film which is formed by, for example, a CVD method using tetraethyl orthosilicate (TEOS) as source gas.

The silicon oxide film which is formed using TEOS as the source gas includes carbon in the film. Therefore, a double bond between carbon atoms can be included in the film. The carbon concentration of the silicon oxide film which is formed using TEOS as the source gas is, for example, equal to or greater than $2 \times 10^{16}$ $cm^{-3}$ and equal to or less than $4 \times 10^{18}$ $cm^{-3}$. Typically, the carbon concentration is $5 \times 10^{17}$ $cm^{-3}$. Therefore, the carbon concentration is less than that of the silicon oxide layer 28 formed by low-temperature thermal oxidation by about three digits.

In the second ultraviolet irradiation heat treatment in Step S113, a heat treatment is performed while the insulating layer 29 is irradiated with ultraviolet rays. The heat treatment is performed in an atmosphere including at least one of oxygen (O), hydrogen (H), deuterium (D), fluorine (F), and water ($H_2O$).

The heat treatment temperature is, for example, equal to or greater than 300° C. and equal to or less than 900° C. The energy of the ultraviolet rays is higher than that in the first ultraviolet irradiation heat treatment in Step S111. The energy of the ultraviolet rays is, for example, equal to or greater than 5 eV and equal to or less than 6 eV.

Some of the double bonds in the insulating layer 29 are broken by the irradiation with ultraviolet rays and a single bond is formed between carbon atoms. The carbon atoms having a single bond therebetween are bonded to, for example, an oxygen atom and are stabilized in the insulating layer 29.

The infrared lamp heating device 200 illustrated in FIG. 5 is also used in the second ultraviolet irradiation heat treatment in Step S113.

When a silicon oxide film is not included in the insulating layer 29, for example, densification annealing may be performed in a nitrogen gas atmosphere or an argon gas atmosphere, instead of the second ultraviolet irradiation heat treatment. In addition, even when a silicon oxide film is included in the insulating layer 29, densification annealing may be additionally performed in, for example, a nitrogen gas atmosphere or an argon gas atmosphere.

The insulating layer 29 is changed to a dense film by the densification annealing. The densification annealing temperature is, for example, equal to or greater than 900° C. and equal to or less than 1300° C.

In Step S114, the gate electrode 30 is formed on the insulating layer 29. The gate electrode 30 is made of, for example, polysilicon including n-type impurities or p-type impurities.

In Step S116, the interlayer insulating film 32 is formed on the gate electrode 30. The interlayer insulating film 32 is, for example, a silicon oxide film.

In Step S118, the source electrode 34 is formed. The source electrode 34 is formed on the source region 18, and the p well contact region 20. The source electrode 34 is formed by, for example, sputtering with nickel (Ni) and aluminum (Al).

In Step S120, the drain electrode 36 is formed. The drain electrode 36 is formed on the rear surface of the silicon carbide substrate 12. The drain electrode 36 is formed by, for example, sputtering with nickel.

In Step S122, a second annealing process is performed in order to reduce the contract resistance between the source electrode 34 and the drain electrode 36. For example, the second annealing process is performed in an argon gas atmosphere at a temperature that is equal to or greater than 400° C. and equal to or less than 1000° C.

The MOSFET 100 illustrated in FIG. 1 is formed by the above-mentioned manufacturing method.

Next, the function and effect of this embodiment will be described.

When a MOSFET is formed using silicon carbide, there is the problem that the mobility of carrier is reduced. It is considered that a surface state between the silicon carbide layer and the gate insulating layer or a level (state) in the gate insulating layer causes a reduction in the mobility of carriers.

When a MOSFET is formed using silicon carbide, there is the problem that a variation in the threshold voltage occurs. In particular, it is considered that, when the gate insulating layer is made of silicon oxide, a level in the bandgap of the silicon oxide causes a variation in the threshold voltage.

First, the surface state between the silicon carbide layer and the gate insulating layer is considered. For example, it is considered that electrons moving through a channel are trapped in the surface state between the silicon carbide layer and the gate insulating layer, which causes a reduction in the mobility of carriers in the MOSFET.

It is considered that the surface state between the silicon carbide layer and the gate insulating layer is generated by the dangling bond of a silicon atom or a carbon atom in the uppermost layer of the silicon carbide layer.

In the MOSFET 100 according to this embodiment, a silicon atom having a dangling bond or a carbon atom having a dangling bond in the uppermost layer of the drift layer 14 and the p well region 16 is substituted with the termination element. Therefore, the dangling bonds are reduced. As a result, a reduction in the mobility of carriers in the MOSFET 100 is prevented.

In the method for manufacturing the MOSFET 100 according to this embodiment, a heat treatment is performed in an atmosphere including the termination element while ultraviolet rays are emitted. A silicon atom having a dangling bond or a carbon atom having a dangling bond in the uppermost layer of the drift layer 14 and the p well region 16 is excited by the irradiation with ultraviolet rays. The excited silicon atom having a dangling bond or the excited carbon atom having a dangling bond is substituted with the termination element.

When a silicon atom or a carbon atom is excited by irradiation with ultraviolet rays, the substitution between the silicon atom or the carbon atom and the termination element is accelerated. Therefore, the dangling bonds are effectively reduced. As a result, the surface state between the silicon carbide layer and the gate insulating layer is reduced.

When UV light is not used, a high-temperature process needs to be performed in an oxygen atmosphere in order to terminate the interface with the termination element. Therefore, the oxidation of the silicon carbide layer progresses and a dangling bond is generated. As a result, the termination efficiency of the interface is reduced.

However, in this embodiment, an element having a dangling bond in the outermost surface can be excited with pinpoint accuracy and can be substituted with the termination element. Therefore, a high-temperature heat treatment in an oxygen atmosphere is not required.

Since the high-temperature heat treatment in the oxygen atmosphere is not required, the oxidation of the silicon carbide layer does not progress. Therefore, dangling bonds do not increase and the termination efficiency of the interface is improved.

In this embodiment, after the interface between the oxide film and the silicon carbide layer is formed, a termination process is performed. Therefore, the termination element can selectively remove the dangling bond at the interface.

When UV light is not used, necessary conditions for the termination of the interface are a high temperature and the presence of oxygen. The inventors found that UV light was appropriately used to selectively terminate the interface, regardless of the conditions of a high temperature or the presence of oxygen.

This embodiment focuses on only the excited element which has a dangling bond, is present in the outermost surface, does not affect other portions, and can be three-fold coordinated to the silicon carbide layer. Therefore, it is possible to effectively reduce the dangling bonds at the interface which form an interface trap.

It is preferable to form the silicon oxide layer 28 using thermal oxidation, in order to form a dense film.

In addition, it is preferable that the thickness of the silicon oxide layer 28 be equal to or less than 10 nm. When the thickness of the silicon oxide layer 28 is greater than 10 nm, there is a concern that the termination element activated by irradiation with ultraviolet rays will be inactivated while passing through the silicon oxide layer 28 and the termination efficiency of the interface will be reduced.

It is preferable that the temperature of thermal oxidation for forming the silicon oxide layer 28 be equal to or greater than 800° C. and equal to or less than 1000° C. When the temperature is lower than the above-mentioned range, it is difficult to form a thermally oxidized film. On the other hand, when the temperature is higher than the above-mentioned range, it is difficult to control the thickness of the film.

It is preferable that the energy of ultraviolet rays in the first ultraviolet irradiation heat treatment be equal to or greater than 3.0 eV and equal to or less than 4.5 eV. When the energy is lower than the above-mentioned range, there is a concern that a silicon atom having a dangling bond or a carbon atom having a dangling bond will not be excited and the termination efficiency of the interface will be reduced. When the energy is higher than the above-mentioned range, there is a concern that the bond between silicon carbide atoms in the drift layer 14 or the p well region 16 below the silicon oxide layer 28 will be broken.

When the formation temperature of the thermally oxidized film is suppressed to a low temperature that is equal to or greater than 800° C. and equal to or less than 1000° C., it is possible to control the number of carbon defects which occur in the silicon carbide layer during the oxidation of the silicon carbide layer. As a result, it is possible to increase the threshold voltage. Specifically, it is possible to obtain a threshold voltage of 3 V to 7 V. In particular, it is possible to obtain a threshold voltage of 5 V to 7 V at a low temperature.

For example, in high-temperature oxidation at a temperature of 1200° C. or more, carbon defects, of which the number is greater than that in low-temperature oxidation by one digit or more, occur in the silicon carbide layer. As a result, the termination element is diffused into the silicon carbide layer and acts as an n-type dopant and the threshold voltage is reduced. In contrast, the diffusion of the termination element into the silicon carbide layer can be prevented at a low temperature. Therefore, the threshold voltage is not reduced and a high threshold voltage is obtained.

Figure 6A:
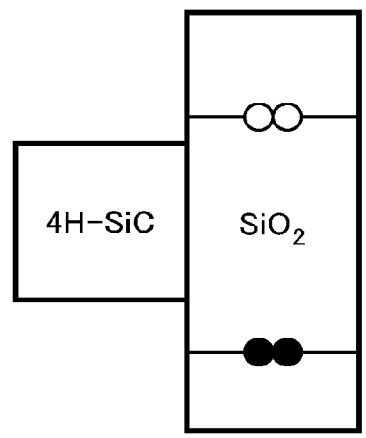
FIGS. 6A, 6B, and 6C are diagrams illustrating the function and effect of the first embodiment.
Figure 6B:
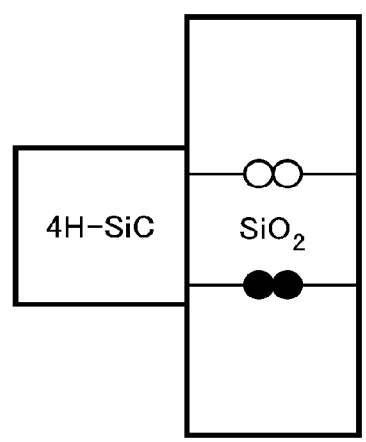
Figure 6C:
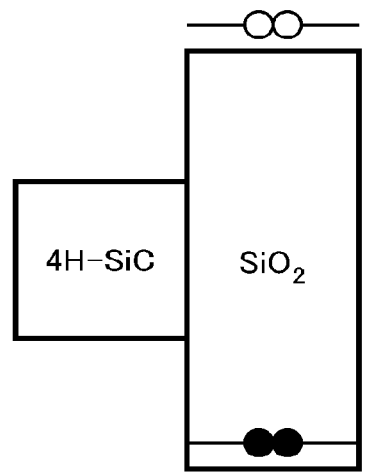

FIGS. 6A, 6B, and 6C are diagrams illustrating the function and effect according to this embodiment. FIGS. 6A and 6B are band diagrams illustrating a case in which there is a double bond between carbon atoms in the silicon oxide film. FIG. 6C is a band diagram illustrating a case in which there is a single bond between carbon atoms in the silicon oxide film. FIGS. 6A, 6B, and 6C are based on the first principle calculation of the inventors.

When there is a double bond between carbon atoms in the silicon oxide film, a level (white circles in FIGS. 6A, 6B, and 6C) which is not filled with electrons and a level (black circles in FIGS. 6A, 6B, and 6C) which is filled with electrons are generated in the silicon oxide film, as illustrated in FIG. 6A and FIG. 6B. The level which is not filled with electrons is located in the vicinity of the lower end of the conduction band of 4H—SiC. In other words, the level at which electrons are trapped is present in the bandgap of the silicon oxide film.

For example, it is considered that, when electrons moving through a channel are trapped at the level which is not filled with electrons, the mobility of carriers in the MOSFET is reduced.

The level which is filled with electrons is located in the vicinity of the upper end of the valence band of 4H—SiC.

As illustrated in FIG. 6B, when the level which is filled with electrons in the bandgap of silicon oxide is present at a position that is higher than the upper end of the valence band of 4H—SiC, electrons are likely to flow to 4H—SiC. At that time, in some cases, a fixed dipole is formed at the interface between silicon carbide and silicon oxide. In this case, the energy difference (hereinafter, referred to as band offset ($\Delta Ec$)) between the lower ends of the conduction bands of silicon carbide (SiC) and silicon oxide ($SiO_2$) is reduced by the fixed dipole.

When the band offset is reduced, the amount of leakage current flowing through the silicon oxide film increases. Therefore, the trapping of electrons to the level in the bandgap is accelerated. As a result, a variation in the threshold voltage increases.

When there is a single bond between carbon atoms in the silicon oxide film, only the level which is filled with electrons is present in the silicon oxide film, as illustrated in FIG. 6C. The level which is not filled with electrons is located at a position that is shallower than the lower end of the conduction band of the silicon oxide film. In other words, the level at which electrons are trapped is not present in the bandgap of the silicon oxide film.

The level filled with electrons is located at a position that is deeper than the upper end of the valence band of 4H—SiC. The level filled with electrons is located in the vicinity of the upper end of the valence band of the silicon oxide film.

Therefore, when there is a single bond between carbon atoms in the silicon oxide film, the electrons moving through the channel of the MOSFET are not trapped at the level of the silicon oxide film. Therefore, a reduction in the mobility of carriers in the MOSFET is prevented.

The level filled with electrons is located at a position that is deeper than the upper end of the valence band of 4H—SiC. Therefore, a fixed dipole is not formed at the interface between silicon carbide and silicon oxide. As a result, band offset is reduced. In addition, a leakage current flowing through the silicon oxide film is suppressed. Therefore, a variation in the threshold voltage of the MOSFET 100 is prevented.

In the MOSFET 100 according to this embodiment, the number of single bonds between carbon atoms in the silicon oxide layer 28 is greater than the number of double bonds between carbon atoms in the silicon oxide layer 28. Therefore, a reduction in the mobility of carriers in the MOSFET 100 is prevented. In addition, a variation in the threshold voltage of the MOSFET 100 is prevented. As a result, the MOSFET 100 with improved characteristics is achieved.

Almost all of the double bonds between carbon atoms can be converted into the single bonds between carbon atoms by the manufacturing method according to this embodiment. Therefore, it is possible to prevent a level from being formed in the bandgap and mobility is improved. In addition, the level filled with electrons is also moved to a position that is deeper than the valence band of 4H—SiC, band offset is not reduced. Therefore, it is possible to prevent a variation in the threshold voltage.

It is preferable that the count value of photoelectrons caused by the single bond between carbon atoms which is measured by X-ray photoelectron spectroscopy be equal to or greater than ten times the count value of photoelectrons caused by the double bond between carbon atoms, in order to improve the characteristics of the MOSFET 100. In the measurement of a C1s peak in an XPS spectrum, the peak of the single bond between carbon atoms can be increased and almost all of the peaks of the double bond between carbon atoms can be removed by the manufacturing method of this embodiment. When the process is sufficiently performed, the structure can be changed such that only the single bonds between carbon atoms are present.

In the measurement of the C1s peak in the XPS spectrum, the peak value of the double bond between carbon atoms is preferably equal to or less than 10% of the peak value of the single bond between carbon atoms, more preferably equal to or less than 2% of the peak value of the single bond between carbon atoms, and most preferably equal to or less than 1% of the peak value of the single bond between carbon atoms, in order to reduce the number of double bonds between carbon atoms.

The carbon atoms having a single bond therebetween are stabilized by oxygen, hydrogen, deuterium, or fluorine. In particular, it is preferable that carbon be bonded to oxygen. That is, it is preferable that carbon is in the bonding state illustrated in FIG. 3B. When the carbon atoms having a single bond therebetween are bonded to an oxygen atom, the stability of the single bond between the carbon atoms is improved.

Next, a case in which the gate insulating layer is a silicon oxide film which is a deposited film formed by a CVD method or a PVD method is considered. For example, a silicon oxide film which is formed by the CVD method using tetraethyl orthosilicate (TEOS) as source gas includes carbon in the film. Therefore, a double bond between carbon atoms can be included in the film.

The carbon concentration of the silicon oxide film which is formed using TEOS as the source gas is, for example, equal to or greater than $2\times10^{16}$ cm$^{-3}$ and equal to or less than $4\times10^{18}$ cm$^{-3}$. Typically, the carbon concentration is $5\times10^{17}$ cm$^{-3}$. Therefore, the carbon concentration is less than that of the silicon oxide layer 28 formed by low-temperature thermal oxidation by about three digits.

The double bond included in the film causes a reduction in the mobility of carriers in the MOSFET or a variation in the threshold voltage of the MOSFET, similarly to the thermally oxidized film.

In the MOSFET 100 according to this embodiment, the number of single bonds between carbon atoms in the insulating layer 29 is greater than the number of double bonds between carbon atoms in the insulating layer 29. Therefore, a reduction in the mobility of carriers in the MOSFET 100 is prevented. In addition, a variation in the threshold voltage of the MOSFET 100 is prevented. As a result, the MOSFET 100 with improved characteristics is achieved. Almost all of the double bonds between carbon atoms can be converted into the signal bonds between carbon atoms by the manufacturing method according to this embodiment.

In both a thermally oxidized film formed by thermal oxidation and a deposited film formed by the CVD method or the PVD method, the carbon atoms included in the silicon oxide film form a double bond in the silicon oxide film and are stabilized.

In the method for manufacturing the MOSFET 100 according to this embodiment, a heat treatment is performed while the silicon oxide film is irradiated with ultraviolet rays to convert the double bond between carbon atoms into the single bond between carbon atoms, thereby making the double bond harmless. When a heat treatment is performed while ultraviolet rays are emitted, conversion into the single bond is accelerated by the following two factors.

The first factor is that some of the double bonds stabilized in the silicon oxide film are broken by irradiation with ultraviolet rays. The second factor is that, for example, oxygen, hydrogen, fluorine, deuterium, or water in the heat treatment atmosphere is activated by irradiation with ultraviolet rays and is likely to be bonded to carbon in the silicon oxide film.

It is considered that the energy of ultraviolet rays required for the first factor needs to be relatively higher than that required for the second factor. For example, it is preferable that energy required for the first factor be equal to or greater than 5.0 eV. It is considered that an energy of 3.0 eV or more is sufficient for the second factor. The energy of ultraviolet rays depends on the wavelength of ultraviolet rays.

In the method for manufacturing the MOSFET 100 according to this embodiment, after the silicon oxide layer 28 is formed by thermal oxidation, a heat treatment (first ultraviolet irradiation heat treatment) is performed while the silicon oxide layer 28 is irradiated with ultraviolet rays. In the first ultraviolet irradiation heat treatment, a silicon atom having a dangling bond or a carbon atom having a dangling bond is substituted with the activated termination element.

As described above, in the first ultraviolet irradiation heat treatment, it is preferable that the energy be equal to or greater than 3.0 eV and equal to or less than 4.5 eV, in order to substitute the silicon atom or the carbon atom with the termination element. The process temperature is, for example, equal to or greater than 300° C. and equal to or less than 900° C. The typical temperature is about 700° C. Therefore, in the first ultraviolet irradiation heat treatment, the double bond between carbon atoms in the silicon oxide layer 28 is mainly converted into the single bond between carbon atoms by the second factor so as to be harmless.

In the method for manufacturing the MOSFET 100 according to this embodiment, a heat treatment (second ultraviolet irradiation heat treatment) is performed while the insulating layer 29 which is a silicon oxide film is irradiated with ultraviolet rays. In the case of the second ultraviolet irradiation heat treatment, the double bond between carbon atoms in the silicon oxide film is converted into the single bond between carbon atoms by the first and second factors so as to be harmless.

In the second ultraviolet irradiation heat treatment, it is preferable that the energy of ultraviolet rays be, for example, equal to or greater than 5.0 eV and equal to or less than 6.0 eV. When the energy of ultraviolet rays is less than 5.0 eV, it is difficult to break the double bond. When the energy of ultraviolet rays is greater than 6.0 eV, there is a concern that bonds in the drift layer 14 below the silicon oxide layer 28 will be broken.

In both the first ultraviolet irradiation heat treatment and the second ultraviolet irradiation heat treatment, the carbon atoms having a single bond therebetween are bonded to, for example, an oxygen atom supplied from the heat treatment atmosphere and are stabilized in silicon oxide.

Figure 7:
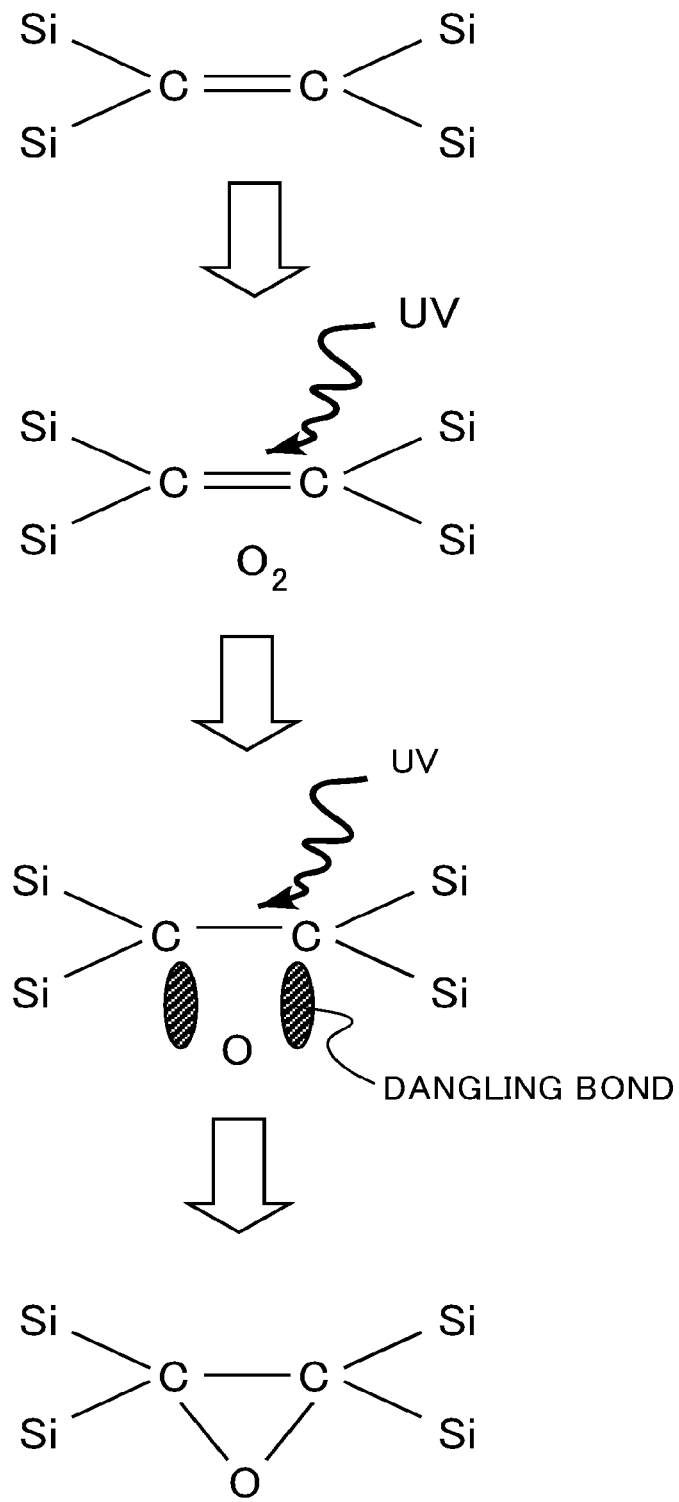
FIG. 7 is a diagram illustrating the function and effect of the first embodiment.
Figure 8:
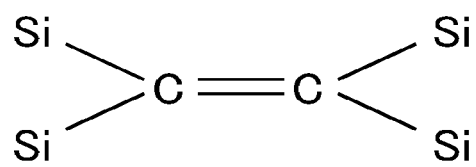
FIG. 8 is a diagram illustrating the function and effect of the first embodiment.
Figure 8:
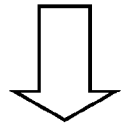
Figure 8:
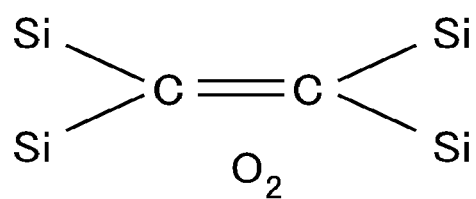
Figure 8:
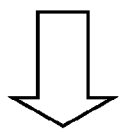
Figure 8:
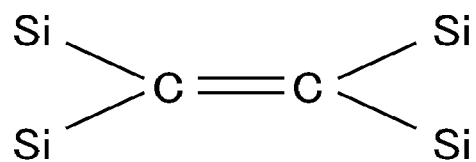

FIGS. 7 and 8 are diagrams illustrating the function and effect of this embodiment. FIG. 7 illustrates a case in which a heat treatment is performed while ultraviolet rays are emitted and FIG. 8 illustrates a case in which a heat treatment is performed while ultraviolet rays are not emitted.

As illustrated in FIG. 7, in the method for manufacturing the MOSFET 100 according to this embodiment, a heat treatment is performed which silicon oxide is irradiated with ultraviolet rays. Some of the double bonds stabilized in the silicon oxide are broken by the irradiation with ultraviolet rays with high energy and the dangling bonds of carbon atoms are formed. In addition, the supplied oxygen in the heat treatment atmosphere is activated.

Then, the double bond between carbon atoms is converted into the single bond between carbon atoms. The carbon atoms having a single bond therebetween are bonded to the activate oxygen atom and is stabilized in the silicon oxide.

In contrast, as illustrated in FIG. 8, in oxygen diffusion without emitting ultraviolet rays, the double bond between carbon atoms in the silicon oxide remains and is not converted into the single bond between carbon atoms.

For example, when a heat treatment is not performed in an atmosphere including oxygen and only irradiation with ultraviolet rays is performed, the dangling bonds of carbon atoms remain. In this case, the remaining dangling bonds of carbon atoms function as a charge trap and there is a concern that the characteristics of the MOSFET will deteriorate.

Before a process is performed according to the manufacturing method of this embodiment, carbon atoms form a double bond therebetween and are stabilized. Therefore, the double bond between carbon atoms can be converted into the single bond between carbon atoms by the manufacturing method according to this embodiment. It is preferable the almost all of the double bonds between carbon atoms be converted into the single bonds between carbon atoms by the manufacturing method according to this embodiment.

It is preferable that the density of the double bonds between carbon atoms in the silicon oxide layer 28 or the insulating layer 29 be, for example, equal to or less than $2 \times 10^{16}$ cm$^{-3}$. For example, the density of the double bonds between carbon atoms can be calculated by an arithmetic process from the measurement of carbon concentration by SIMS and the ratio of single bonds to double bonds measured by X-ray photoelectron spectroscopy.

The heat treatment atmosphere can be changed to bond the carbon atoms having a single bond therebetween to a hydrogen atom, a deuterium atom, a fluorine atom, or a hydroxyl group.

In both the first ultraviolet irradiation heat treatment and the second ultraviolet irradiation heat treatment, the heat treatment temperature is preferably equal to or greater than 300° C. and equal to or less than 900° C. When the heat treatment temperature is lower than the above-mentioned range, a material in the heat treatment atmosphere, for example, oxygen is insufficiently diffused to silicon oxide. As a result, there is a concern that the carbon atoms having a single bond therebetween will not be bonded to an oxygen atom. When the heat treatment temperature is higher than the above-mentioned range, for example, there is a concern that the oxidation of the drift layer 14 below the silicon oxide layer 28 will progress.

It is preferable that the thickness of the insulating layer 29 be equal to or greater than 20 nm and equal to or less than 150 nm. When the thickness is less than the above-mentioned range, there is a concern that the bonds in the drift layer 14 below the silicon oxide layer 28 will be broken during irradiation with ultraviolet rays. When the thickness is greater than the above-mentioned range, there is a concern that a region in which the carbon atoms having a single bond therebetween are not bonded to an oxygen atom will be generated. It is preferable that the thickness of the insulating layer 29 be equal to or greater than 20 nm and equal to or less than 60 nm.

It is preferable that gas used in the first ultraviolet irradiation heat treatment be nitrogen oxide gas such as NO, $N_2O$, or $NO_2$. This is because nitrogen in nitrogen oxide gas which will be a termination element can effectively terminate the interface between silicon carbide and the gate insulating layer. In addition, this is because the carbon atoms having a single bond therebetween are bonded to an oxygen atom in the nitrogen oxide gas to form a stable single bond between the carbon atoms.

A UV irradiation process for the oxides of other termination elements is also effective. For example, a UV irradiation process for PO, $P_2O$, $PO_2$, and $P_2O_5$ is effective. In this case, the interface can be terminated with high efficiency and the carbon atoms having a single bond therebetween can be bonded to an oxygen atom in the gas to form a stable single bond between the carbon atoms.

Figure 9:
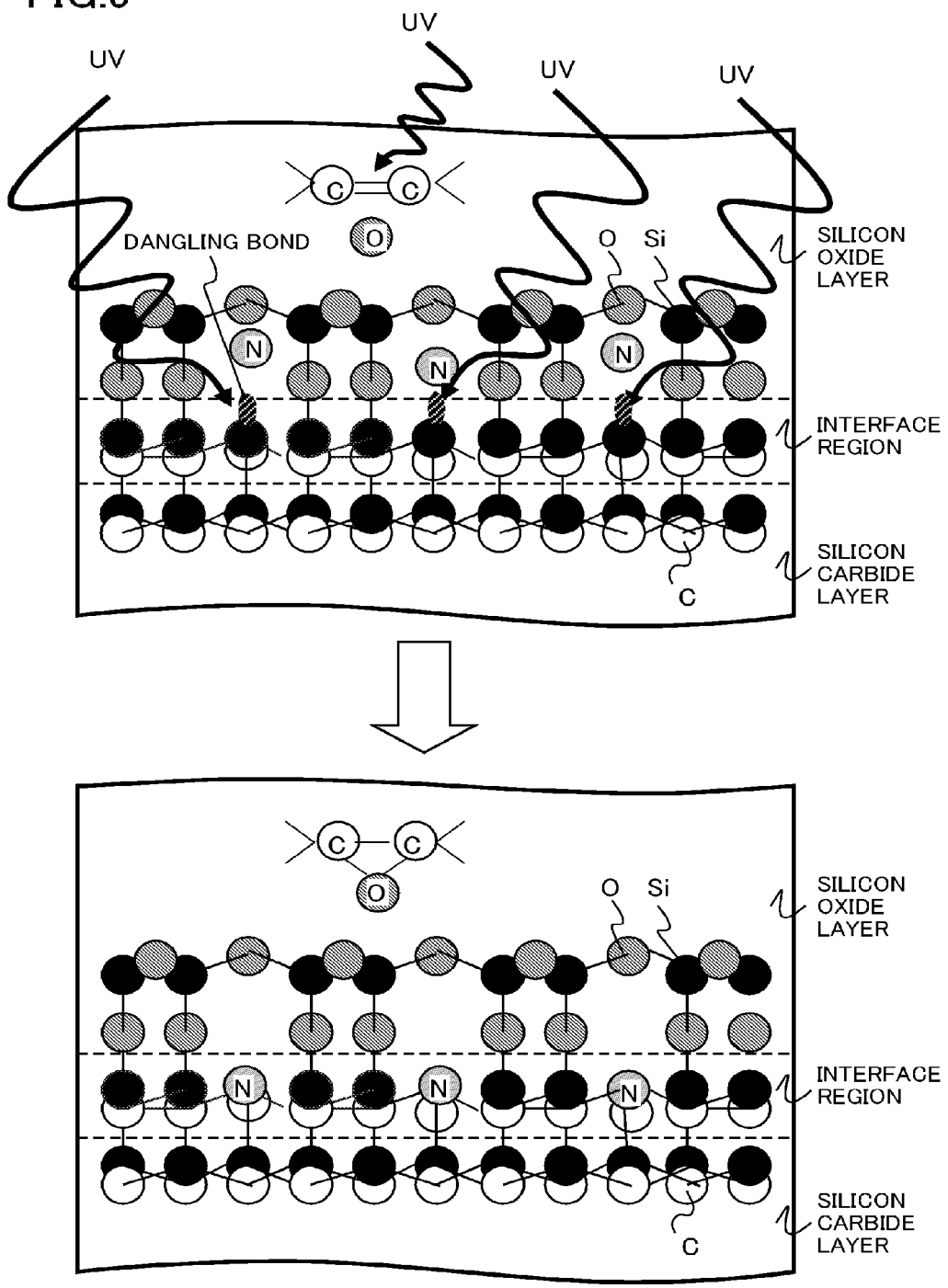
FIG. 9 is a diagram illustrating the function and effect of the first embodiment.

FIG. 9 is a diagram illustrating the function and effect of this embodiment. In the manufacturing method according to this embodiment, a heat treatment is performed in an atmosphere that includes the termination element and includes at least one of oxygen (O), hydrogen (H), deuterium (D), fluorine (F), and water ($H_2O$) while the silicon oxide layer on the silicon carbide layer is irradiated with ultraviolet (UV) rays. FIG. 9 illustrates an example in which the material is oxygen and the termination element is nitrogen.

The conversion of the double bond between carbon atoms into a single bond and the substitution of a silicon atom having a dangling bond at the interface with a nitrogen atom are performed at the same time by the irradiation with ultraviolet rays.

As described above, according to this embodiment, a reduction in the mobility of carries in the MOSFET 100 is prevented. In addition, a variation in the threshold voltage of the MOSFET 100 is prevented. Therefore, the MOSFET 100 with improved characteristics is achieved.

Second Embodiment

A semiconductor device manufacturing method according to this embodiment differs from the semiconductor device manufacturing method according to the first embodiment in that the silicon oxide layer is not a thermally oxidized film formed by thermal oxidation, but is a deposited film. Hereinafter, the description of the same content as that in the first embodiment will not be repeated.

In the manufacturing method according to this embodiment, a silicon oxide layer 28 is formed by, for example, a CVD method or a PVD method in Step S110 illustrated in FIG. 4. The silicon oxide layer 28 is a deposited film. The thickness of the silicon oxide layer 28 is, for example, equal to or greater than 1 nm and equal to or less than 10 nm.

The silicon oxide layer 28 is, for example, a silicon oxide film which is formed by the CVD method using tetraethyl orthosilicate (TEOS) as source gas. In addition, the silicon oxide layer 28 is, for example, a high-temperature oxide film (HTO film) which is formed by the CVD method using dichlorosilane ($SiH_2Cl_2$) and nitrous oxide ($N_2O$) as source gas.

The deposited film includes carbon and has a lower carbon concentration than the thermally oxidized film. Therefore, there is a double bond between carbon atoms in the silicon oxide film.

The carbon concentration of the silicon oxide layer 28 is, for example, equal to or greater than $2 \times 10^6$ cm$^{-3}$ and equal to or less than $4 \times 10^{18}$ cm$^{-3}$. In addition, the carbon concentration is, for example, equal to or greater than $2 \times 10^{17}$ cm$^{-3}$ and equal to or less than $1 \times 10^{18}$ cm$^{-3}$. Typically, the carbon concentration is about $5 \times 10^{17}$ cm$^{-3}$.

In the manufacturing method according to this embodiment, similarly to the first embodiment, the double bond between carbon atoms in the silicon oxide film is converted into the single bond between carbon atoms so as to be harmless.

As described above, according to this embodiment, a reduction in the mobility of carriers in the MOSFET is prevented. In addition, a variation in the threshold voltage of the MOSFET is prevented. Therefore, a MOSFET with improved characteristics is achieved.

Third Embodiment

In a semiconductor device manufacturing method according to this embodiment, a silicon oxide layer is formed on a silicon carbide layer and a heat treatment is performed in an atmosphere including at least one element selected from the group consisting of nitrogen (N), phosphorus (P), arsenic (As), antimony (Sb), scandium (Sc), yttrium (Y), and lanthanoids (La, Ce, Pr, Nd, Pm, Sm, Eu, Gd, Tb, Dy, Ho, Er, Tm, Yb, and Lu) while the silicon oxide layer is irradiated with ultraviolet rays.

The semiconductor device manufacturing method according to this embodiment differs from the semiconductor device manufacturing method according to the first embodiment in that an atmosphere when ultraviolet rays are emitted does not necessarily include at least one of oxygen (O), hydrogen (H), fluorine (F), deuterium (D), and water ($H_2O$). Hereinafter, the description of the same content as that in the first embodiment will not be repeated.

In the manufacturing method according to this embodiment, in the first ultraviolet irradiation heat treatment in Step S111 illustrated in FIG. 4, a heat treatment is performed in an atmosphere including at least one element selected from the group consisting of nitrogen (N), phosphorus (P), arsenic (As), antimony (Sb), bismuth (Bi), scandium (Sc), yttrium (Y), and lanthanoids (La, Ce, Pr, Nd, Pm, Sm, Eu, Gd, Tb, Dy, Ho, Er, Tm, Yb, and Lu).

For example, the heat treatment is performed in a nitrogen gas ($N_2$) atmosphere.

A silicon atom having a dangling bond or a carbon atom having a dangling bond in the uppermost layer of the drift layer 14 and the p well region 16 is excited by irradiation with ultraviolet rays according to this embodiment. In addition, nitrogen atoms in the atmosphere are activated by the irradiation with ultraviolet rays. The excited silicon atom having a dangling bond or the excited carbon atom having a dangling bond is substituted with the activated nitrogen atom.

The heat treatment temperature is, for example, equal to or greater than 300° C. and equal to or less than 900° C. The heat treatment temperature is, for example, 700° C. However, only in a gas atmosphere including no oxygen, the heat treatment may be performed at a high temperature that is greater than 900° C. For example, the heat treatment temperature may be greater than 900° C. and equal to or less than 1400° C.

A silicon atom or a carbon atom which is an element in the outermost surface is excited by irradiation with ultraviolet rays and the substitution between the silicon atom or the carbon atom and a nitrogen atom is accelerated. Therefore, dangling bonds are effectively reduced. As a result, the surface state between the silicon carbide layer and the gate insulating layer is reduced.

As described above, according to this embodiment, a reduction in the mobility of carriers in the MOSFET is prevented. Therefore, a MOSFET with improved characteristics is achieved.

In this embodiment, the UV irradiation heat treatment in an $N_2$ gas atmosphere has been described. However, for example, it is considered that P is diffused into an insulating film and then the UV irradiation heat treatment is performed. Specifically, $P_2O_5$ is diffused into $SiO_2$ and the heat treatment is performed in a $N_2$ or Ar atmosphere at a temperature of 700° C. while UV light is emitted with an energy of 4 eV. Then, the outermost surface element (Si or C) which is in an excited state and has a dangling bond in the interface is substituted with P. It is possible to effectively terminate the interface.

At that time, an element which does not having a dangling bond, that is, an element which has been bonded to the insulating film is not substituted. That is, it is possible to remove only the dangling bond forming the surface state with pinpoint accuracy.

Fourth Embodiment

A semiconductor device manufacturing method according to this embodiment differs from the semiconductor device manufacturing method according to the third embodiment in that the silicon oxide layer is not a thermally oxidized film formed by thermal oxidation, but is a deposited film. Hereinafter, the description of the same content as that in the third embodiment will not be repeated.

In the manufacturing method according to this embodiment, a silicon oxide layer 28 is formed by, for example, a CVD method or a PVD method in Step S110 illustrated in FIG. 4. The silicon oxide layer 28 is a deposited film. The thickness of the silicon oxide layer 28 is, for example, equal to or greater than 1 nm and equal to or less than 10 nm.

The silicon oxide layer 28 is, for example, a silicon oxide film which is formed by the CVD method using tetraethyl orthosilicate (TEOS) as source gas. In addition, the silicon oxide layer 28 is, for example, a high-temperature oxide film (HTO film) which is formed by the CVD method using dichlorosilane ($SiH_2Cl_2$) and nitrous oxide ($N_2O$) as source gas.

In the manufacturing method according to this embodiment, similarly to the third embodiment, the surface state between the silicon carbide layer and the gate insulating layer is reduced.

As described above, according to this embodiment, a reduction in the mobility of carriers in the MOSFET is prevented. Therefore, a MOSFET with improved characteristics is achieved.

Fifth Embodiment

A semiconductor device according to this embodiment is the same as the semiconductor device according to the first embodiment except that the carbon concentration of a gate-electrode-side region of the insulating layer 29 is high. In addition, the semiconductor device according to this embodiment is the same as the semiconductor device according to the first embodiment except that carbon ions are implanted after the insulating layer 29 is formed and before the second ultraviolet irradiation heat treatment is performed. Hereinafter, the description of the same content as that in the first embodiment will not be repeated.

In this embodiment, the insulating layer 29 is, for example, a silicon oxide film.

In the semiconductor device according to this embodiment, the carbon concentration of a region of the insulating layer 29 which is close to the gate electrode 30 in FIG. 1 is higher than the carbon concentration of a region of the insulating layer 29 which is close to the silicon oxide layer 28. The carbon concentration of a region of the insulating layer 29 which comes into contact with the gate electrode 30 is higher than the carbon concentration of the other regions. A high-carbon-concentration region is provided in a portion of the insulating layer 29 which comes into contact with the gate electrode 30.

In a manufacturing method according to this embodiment, after the formation of the insulating layer 29 in Step S112 illustrated in FIG. 4, carbon ions are implanted into the insulating layer 29. Then, the second ultraviolet irradiation heat treatment in Step S113 is performed.

For example, in some cases, impurities in the gate electrode 30 are diffused out of the gate electrode 30 while a MOSFET is being manufactured or when the MOSFET is being used. The impurities are, for example, boron (B). When the impurities are diffused out of the gate electrode 30, a variation in the characteristics of the MOSFET is likely to occur.

According to this embodiment, the high-carbon-concentration region of the insulating layer 29 prevents the diffusion of impurities into the gate electrode 30. Therefore, a variation in the characteristics of the MOSFET is prevented.

When there is a double bond between carbon atoms in the insulating layer 29, the characteristics of the MOSFET deteriorate due to the level formed in the insulating layer 29. In this embodiment, the double bond between carbon atoms in the insulating layer 29 is converted into a single bond so as to be harmless. Therefore, the deterioration of the characteristics of the MOSFET due to the high-carbon-concentration region is prevented.

As described above, according to this embodiment, a reduction in the mobility of carriers in the MOSFET is prevented. In addition, a variation in the characteristics of the MOSFET is prevented. Therefore, a MOSFET with improved characteristics is achieved.

Sixth Embodiment

A semiconductor device according to this embodiment differs from the semiconductor device according to the first embodiment in that an interface region is provided in a termination region of a MOSFET. The description of the same content as that in the first embodiment will not be repeated.

Figure 10:
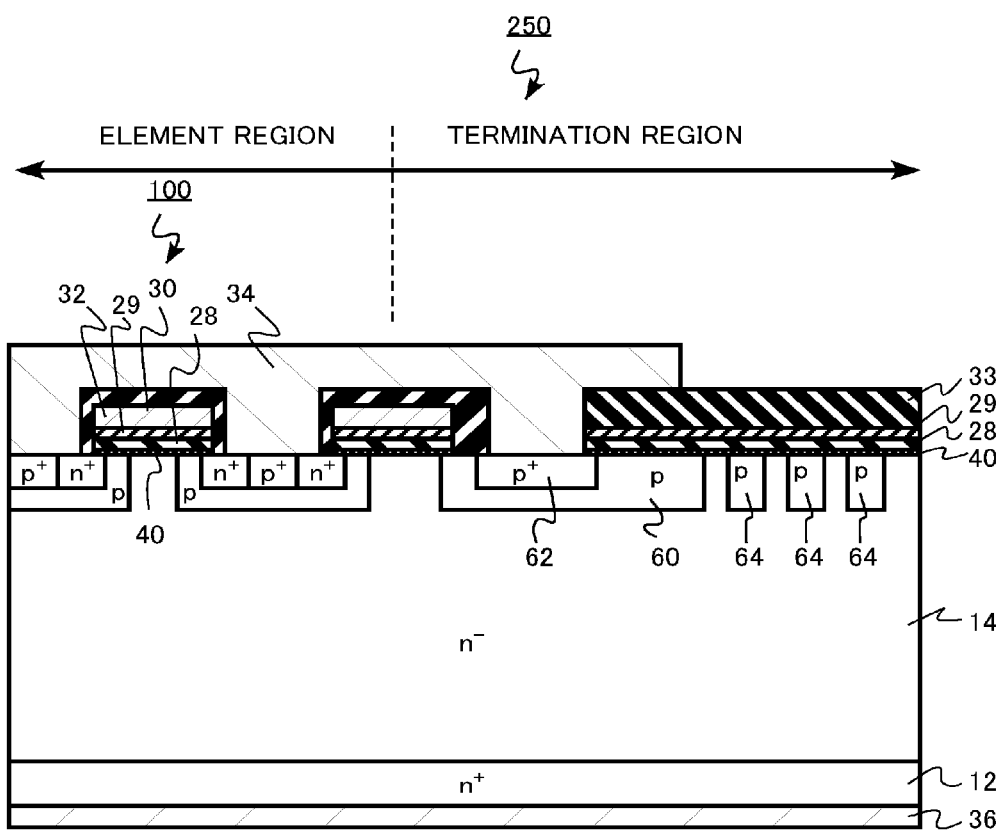
FIG. 10 is a cross-sectional view schematically illustrating a semiconductor device according to a sixth embodiment.

FIG. 10 is a cross-sectional view schematically illustrating the structure of the MOSFET which is the semiconductor device according to this embodiment. A MOSFET 250 includes an element region and a termination region that is provided around the element region. The termination region has a function of improving the breakdown voltage of the MOSFET 250.

For example, the MOSFET 100 according to the first embodiment is provided as a unit cell in the element region.

The termination region includes a p-type RESURF region (silicon carbide layer) 60, a p⁺ contact region 62, a p-type guard ring region (silicon carbide layer) 64, an interface region 40, a silicon oxide layer 28, an insulating layer 29, and a field oxide film 33. The interface region 40 is provided between a surface of the p-type RESURF region 60 and the field oxide film 33 and between a surface of the p-type guard ring region 64 and the field oxide film 33.

The interface region 40, the silicon oxide layer 28, and the insulating layer 29 have the same structure as those in the first embodiment.

The insulating layer 29 is, for example, a silicon oxide film. The field oxide film 33 is, for example, a silicon oxide film.

When the MOSFET 250 is turned off, a depletion layer is formed in the RESURF region 60, the guard ring regions 64, and a portion of the drift layer (silicon carbide layer) 14 between the guard ring regions 64 and the breakdown voltage of the MOSFET 250 is improved.

However, when there is a surface state at the interface between the RESURF region 60 and the field oxide film 33 and the interface between the guard ring region 64 and the field oxide film 33 or when there is a surface state in the silicon oxide layer 28 and the insulating layer 29, charge is trapped in the surface state. There is a concern that a desired depletion layer will not be formed by the trapped charge. In this case, the breakdown voltage of the MOSFET 250 is reduced.

According to this embodiment, since the interface region 40 is provided, the surface state is terminated. In addition, the double bond between carbon atoms in the silicon oxide layer 28 and the insulating layer 29 is converted so as to be harmless. Therefore, a desired depletion layer is formed and the MOSFET 250 with a stable breakdown voltage is achieved.

Seventh Embodiment

An inverter circuit and a driving device according to this embodiment includes the semiconductor device according to the first embodiment.

Figure 11:
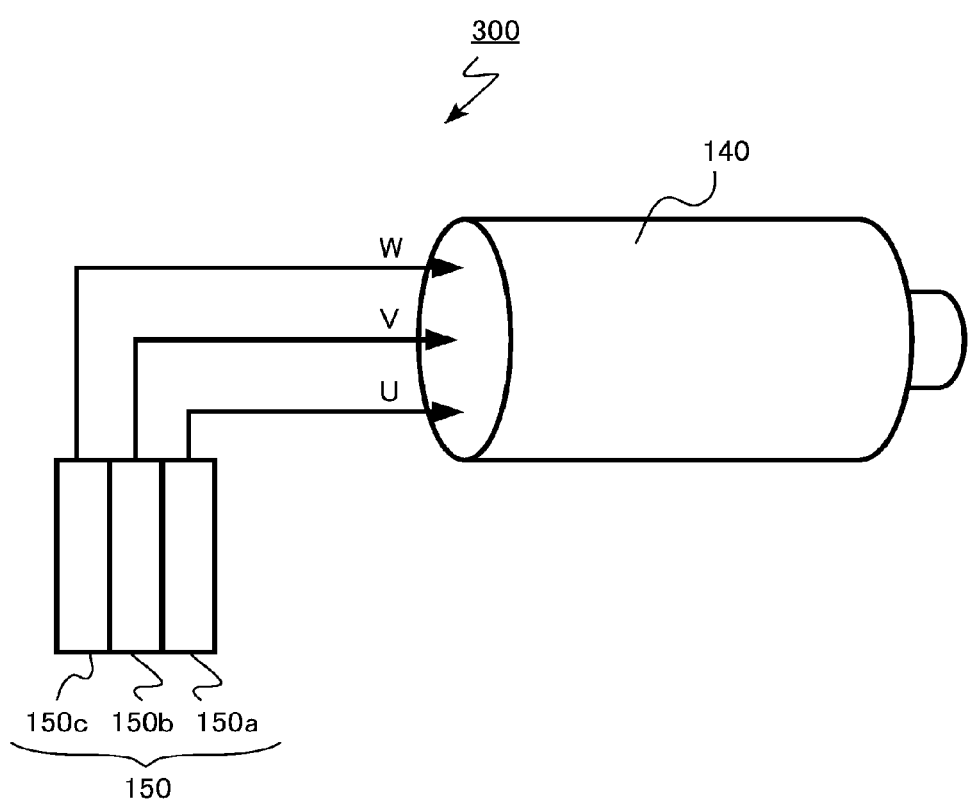
FIG. 11 is a diagram schematically illustrating a driving device according to a seventh embodiment.

FIG. 11 is a diagram schematically illustrating the driving device according to this embodiment. A driving device 300 includes a motor 140 and an inverter circuit 150.

The inverter circuit 150 includes three semiconductor modules 150a, 150b, and 150c having the MOSFET 100 according to the first embodiment as a switching element. The three semiconductor modules 150a, 150b, and 150c are connected in parallel to each other to form the three-phase inverter circuit 150 including three AC voltage output terminals U, V, and W. The motor 140 is drive by an AC voltage which is output from the inverter circuit 150.

According to this embodiment, since the inverter circuit includes the MOSFET 100 with improved characteristics, it is possible to improve the characteristics of the inverter circuit 150 and the driving device 300.

Eighth Embodiment

A vehicle according to this embodiment includes the semiconductor device according to the first embodiment.

Figure 12:
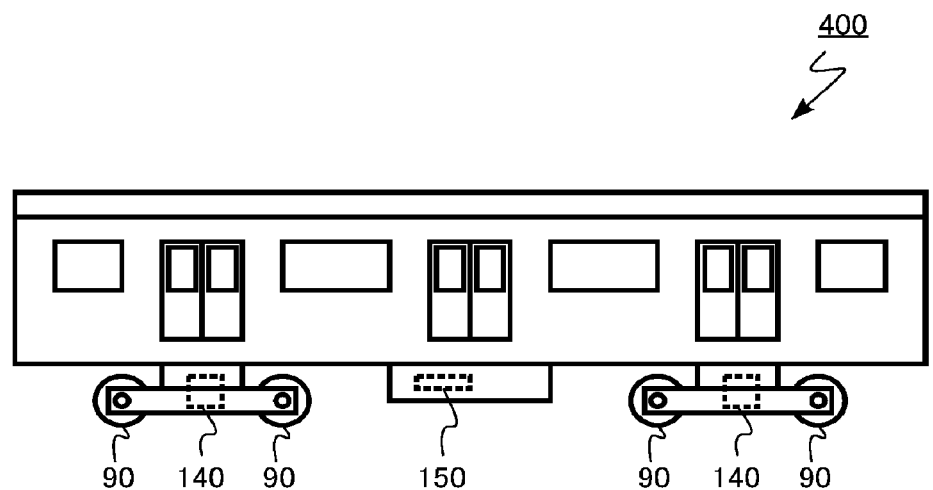
FIG. 12 is a diagram schematically illustrating a vehicle according to an eighth embodiment.

FIG. 12 is a diagram schematically illustrating the vehicle according to this embodiment. A vehicle 400 according to this embodiment is a railway vehicle. The vehicle 400 includes a motor 140 and an inverter circuit 150.

The inverter circuit 150 includes three semiconductor modules having the MOSFET 100 according to the first embodiment as a switching element. The three semiconductor modules are connected in parallel to each other to form the three-phase inverter circuit 150 having three AC voltage output terminals U, V, and W. The motor 140 is driven by an AC voltage which is output from the inverter circuit 150. Wheels 90 of the vehicle 400 are rotated by the motor 140.

According to this embodiment, since the vehicle 400 includes the MOSFET 100 with improved characteristics, the characteristics of the vehicle 400 are improved.

Ninth Embodiment

A vehicle according to this embodiment includes the semiconductor device according to the fifth embodiment.

Figure 13:
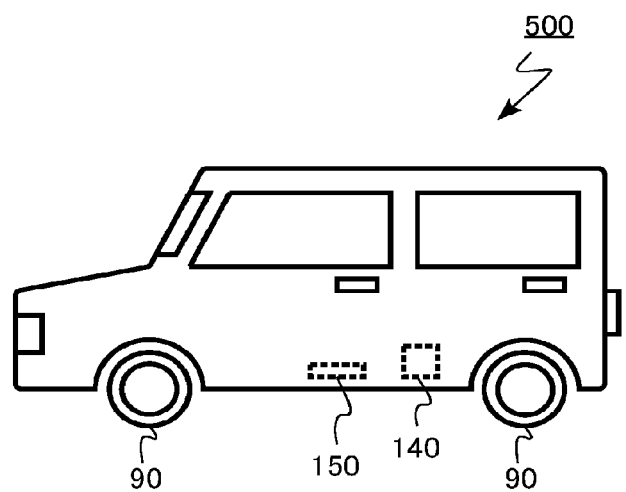
FIG. 13 is a diagram schematically illustrating a vehicle according to a ninth embodiment.

FIG. 13 is a diagram schematically illustrating the vehicle according to this embodiment. A vehicle 500 according to this embodiment is a car. The vehicle 500 includes a motor 140 and an inverter circuit 150.

The inverter circuit 150 includes three semiconductor modules having the MOSFET 100 according to the first embodiment as a switching element. The three semiconductor modules are connected in parallel to each other to form the three-phase inverter circuit 150 having three AC voltage output terminals U, V, and W.

The motor 140 is driven by an AC voltage which is output from the inverter circuit 150. Wheels 90 of the vehicle 500 are rotated by the motor 140.

According to this embodiment, since the vehicle 500 includes the MOSFET 100 with improved characteristics, the characteristics of the vehicle 500 are improved.

Tenth Embodiment

An elevator according to this embodiment includes the semiconductor device according to the first embodiment.

Figure 14:
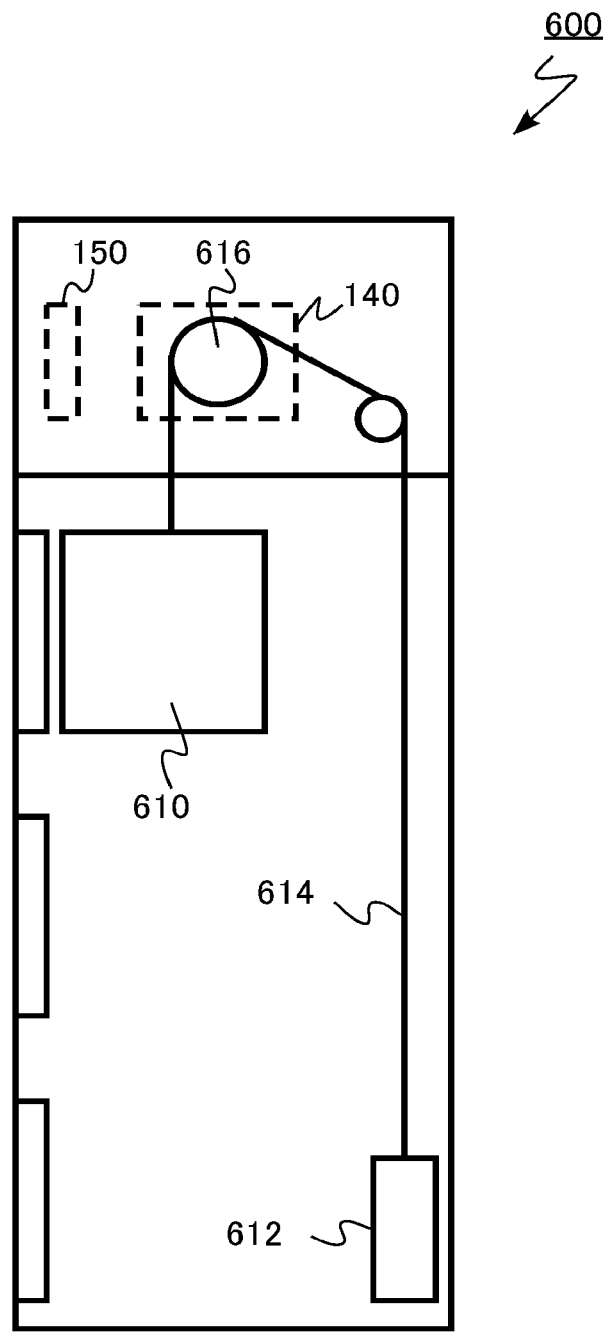
FIG. 14 is a diagram schematically illustrating an elevator according to a tenth embodiment.

FIG. 14 is a diagram schematically illustrating the elevator according to this embodiment. An elevator 600 according to this embodiment includes a basket 610, a counter weight 612, a wire rope 614, a hoist 616, a motor 140, and an inverter circuit 150.

The inverter circuit 150 includes three semiconductor modules having the MOSFET 100 according to the first embodiment as a switching element. The three semiconductor modules are connected in parallel to each other to form the three-phase inverter circuit 150 having three AC voltage output terminals U, V, and W.

The motor 140 is driven by an AC voltage which is output from the inverter circuit 150. The hoist 616 is rotated by the motor 140 to move up and down the basket 610.

According to this embodiment, since the elevator 600 includes the MOSFET 100 with improved characteristics, the characteristics of the elevator 600 are improved.

In the first embodiment, an example in which the crystal structure of silicon carbide is 4H—SiC has been described. However, the invention can be applied to silicon carbide with other crystal structures such as 6H—SiC and 3C—SiC.

In the first embodiment, an example in which the silicon oxide layer 28 is provided on the silicon face of silicon carbide has been described. However, the invention may be applied to a case in which the silicon oxide layer 28 is provided on other faces of silicon carbide, such as a carbon face, an a-face, an m-face, and a (0-33-8) face.

In the first embodiment, the n-channel planar MOSFET is given as an example. However, the invention may be applied to an n-channel trench MOSFET. The typical example of the side face of the trench is an a-face, an m-face, or a (0-33-8) face. The a-face and the m-face are perpendicular to the Si face and the C face. The (0-33-8) face is inclined at an angle of 54.70 with respect to the (0001) face in a <1-100> direction. This crystal face orientation is a crystal face corresponding to Si(001) in the Si crystal.

The invention may be applied to an n-channel insulated gate bipolar transistor (IGBT).

The invention is not limited to the n-channel type and may be applied to a p-channel MOSFET or IGBT.

In the eighth to tenth embodiments, an example in which the semiconductor device according to this invention is applied to the vehicle or the elevator has been described. However, the semiconductor device according to this invention may be applied to, for example, a power conditioner of a photovoltaic power generation system.

While certain embodiments have been described, these embodiments have been presented by way of example only, and are not intended to limit the scope of the inventions. Indeed, the semiconductor device, the semiconductor device manufacturing method, the inverter circuit, the driving device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a silicon carbide layer;
a silicon oxide layer including carbon, the silicon oxide layer including single bonds between carbon atoms which are at least a part of the carbon, the number of the single bonds between carbon atoms being greater than the number of double bonds between carbon atoms which are at least a part of the carbon; and
a region provided between the silicon carbide layer and the silicon oxide layer, the region including at least one element selected from the group consisting of nitrogen (N), phosphorus (P), arsenic (As), antimony (Sb), bismuth (Bi), scandium (Sc), yttrium (Y), and lanthanoids (La, Ce, Pr, Nd, Pm, Sm, Eu, Gd, Tb, Dy, Ho, Er, Tm, Yb, and Lu),
wherein, in at least a part of the single bonds between carbon atoms, each of two carbon atoms bonded by each of the at least a part of the single bonds is bonded to same oxygen atom.

2. The semiconductor device according to claim 1, wherein a carbon concentration of the silicon oxide layer is equal to or greater than $2 \times 10^{16}$ cm$^{-3}$ and equal to or less than $2 \times 10^{22}$ cm$^{-3}$.

3. The semiconductor device according to claim 1, wherein a peak of a concentration distribution of the at least one element is equal to or greater than $4 \times 10^{16}$ cm$^{-3}$ and equal to or less than $4 \times 10^{20}$ cm$^{-3}$.

4. The semiconductor device according to claim 1, wherein a full width at half maximum of a concentration distribution of the at least one element is equal to or less than 1 nm.

5. The semiconductor device according to claim 1, further comprising:
a gate electrode, the silicon oxide layer being provided between the region and the gate electrode.

6. An inverter circuit comprising:
the semiconductor device according to claim 1.

7. A driving device comprising:
the semiconductor device according to claim 1.

8. A vehicle comprising:
the semiconductor device according to claim 1.

9. An elevator comprising:
the semiconductor device according to claim 1.

10. A semiconductor device comprising:
silicon carbide layer;
a silicon oxide layer including carbon, the silicon oxide layer including single bonds between carbon atoms which are at least apart of the carbon, the number of the single bonds between carbon atoms being greater than the number of double bonds between carbon atoms which are at least a part of the carbon; and
a region provided between the silicon carbide layer and the silicon oxide layer, the region including at least one element selected from the group consisting of nitrogen (N), phosphorus (P), arsenic (As), antimony (Sb), bismuth (Bi), scandium (Sc), yttrium (Y), and lanthanoids (La, Ce, Pr, Nd, Pm, Sm, Eu, Gd, Tb, Dy, Ho, Er, Tm, Yb, and Lu), wherein, in at least a part of the single bonds between carbon atoms, each of two carbon atoms bonded by each of the at least a part of the single bond is bonded to one hydrogen atom, one deuterium atom, one fluorine atom, or one hydroxyl group.

11. The semiconductor device according to claim 10, wherein a carbon concentration of the silicon oxide layer is equal to or greater than $2 \times 10^{16}$ cm$^{-3}$ and equal to or less than $2 \times 10^{22}$ cm$^{-3}$.

12. The semiconductor device according to claim 10, wherein a peak of a concentration distribution of the at least one element is equal to or greater than $4 \times 10^{16}$ cm$^{-3}$ and equal to or less than $4 \times 10^{20}$ cm$^{-3}$.

13. The semiconductor device according to claim 10, wherein a full width at half maximum of a concentration distribution of the at least one element is equal to or less than 1 nm.

14. A method of manufacturing a semiconductor device comprising:
    forming a silicon oxide layer on a silicon carbide layer; and
    performing a heat treatment in an atmosphere including at least one of oxygen (O), hydrogen (H), deuterium (D), fluorine (F), and water (H$_2$O) and including at least one element selected from the group consisting of nitrogen (N), phosphorus (P), arsenic (As), antimony (Sb), bismuth (Bi), scandium (Sc), yttrium (Y), and lanthanoids (La, Ce, Pr, Nd, Pm, Sm, Eu, Gd, Tb, Dy, Ho, Er, Tm, Yb, and Lu) while irradiating the silicon oxide layer with ultraviolet rays,
    wherein an energy of the ultraviolet rays is equal to or greater than 3.0 eV and equal to or less than 4.5 eV.

15. The method of manufacturing a semiconductor device according to claim 14,
    wherein a thickness of the silicon oxide layer is equal to or less than 10 nm.

16. The method of manufacturing a semiconductor device according to claim 14,
    wherein the silicon oxide layer is formed by thermally oxidizing the silicon carbide layer.

17. The method of manufacturing a semiconductor device according to claim 16,
    wherein a temperature of the thermal oxidation is equal to or greater than 800° C. and equal to or less than 1000° C.

18. The method of manufacturing a semiconductor device according to claim 14,
    wherein a temperature of the heat treatment is equal to or greater than 300° C. and equal to or less than 900° C.

19. A method of manufacturing a semiconductor device comprising:
    forming a silicon oxide layer on a silicon carbide layer; and
    performing a heat treatment in an atmosphere including at least one element selected from the group consisting of nitrogen (N), phosphorus (P), arsenic (As), antimony (Sb), bismuth (Bi), scandium (Sc), yttrium (Y), and lanthanoids (La, Ce, Pr, Nd, Pm, Sm, Eu, Gd, Tb, Dy, Ho, Er, Tm, Yb, and Lu) while irradiating the silicon oxide layer with ultraviolet rays,
    wherein an energy of the ultraviolet rays is equal to or ater than 3.0 eV and equal to or less than 4.5 eV.

20. The method of manufacturing a semiconductor device according to claim 19, wherein a thickness of the silicon oxide layer is equal to or less than 10 nm.

* * * * *